US008725936B2

(12) United States Patent
Oikawa et al.

(10) Patent No.: US 8,725,936 B2
(45) Date of Patent: May 13, 2014

(54) STORAGE SYSTEM WITH FLASH MEMORY, AND STORAGE CONTROL METHOD

(75) Inventors: Yoshihiro Oikawa, Kaisei (JP); Akifumi Suzuki, Yokohama (JP); Taichi Yotsumoto, Hirastuka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/501,229

(22) PCT Filed: Mar. 30, 2012

(86) PCT No.: PCT/JP2012/002225
§ 371 (c)(1),
(2), (4) Date: Apr. 10, 2012

(87) PCT Pub. No.: WO2013/145024
PCT Pub. Date: Oct. 3, 2013

(65) Prior Publication Data
US 2013/0262749 A1    Oct. 3, 2013

(51) Int. Cl.
*G06F 12/00*    (2006.01)
*G06F 13/00*    (2006.01)
*G06F 13/28*    (2006.01)

(52) U.S. Cl.
USPC ................................ 711/103; 711/E12.008

(58) Field of Classification Search
USPC .......................................... 711/103, E12.008
See application file for complete search history.

(56) References Cited

U.S. PATENT DOCUMENTS

| 6,000,006 | A | * | 12/1999 | Bruce et al. | .................. | 711/103 |
| 2006/0233020 | A1 | * | 10/2006 | Ruby et al. | ................ | 365/185.2 |
| 2008/0288814 | A1 | * | 11/2008 | Kitahara | ........................... | 714/5 |
| 2009/0150593 | A1 | * | 6/2009 | Hamilton et al. | ............. | 711/101 |
| 2009/0172267 | A1 | * | 7/2009 | Oribe et al. | .................. | 711/103 |
| 2010/0107021 | A1 | | 4/2010 | Nagadomi et al. | | |
| 2010/0271874 | A1 | * | 10/2010 | Mokhlesi et al. | ........ | 365/185.02 |
| 2012/0060066 | A1 | | 3/2012 | Nagadomi et al. | | |
| 2012/0236639 | A1 | * | 9/2012 | Camp et al. | ............. | 365/185.02 |

FOREIGN PATENT DOCUMENTS

| JP | 2008-287404 | 11/2008 |
| JP | 2010-0107021 | 4/2009 |

OTHER PUBLICATIONS

PCT International Search Report and Written Opinion on application PCT/JP2012/002225 mailed Oct. 5, 2012; 13 pages.

* cited by examiner

*Primary Examiner* — Sheng-Jen Tsai
(74) *Attorney, Agent, or Firm* — Foley & Lardner LLP

(57) ABSTRACT

A storage system has: one or more flash memory chips, each of which has a storage region configured by a plurality of blocks; and a device controller that controls access to data corresponding to the storage regions of the flash memory chips. The device controller manages for each of the blocks the number of determination readings for determining read disturb on the basis of a read request with respect to data of each block from a higher-level device, and, when there is a block for which the number of determination readings becomes equal to or larger than a threshold represented as a standard indicating a predetermined state related to read disturb, transmits, to the higher-level device, notification information that includes information indicating that read disturb of the block enters the predetermined state.

12 Claims, 33 Drawing Sheets

FIG. 7A

[Number of PE, less than 3000]

| PE interval | Deterioration level subtraction point |
|---|---|
| 6 minutes or less | 40 |
| 12 minutes or less | 35 |
| ⋮ | ⋮ |
| erase→erase | 1 |

FIG. 7B

[Number of PE, 3000 or more]

| PE interval | Deterioration level subtraction point |
|---|---|
| 6 minutes or less | 160 |
| 12 minutes or less | 80 |
| ⋮ | ⋮ |
| erase→erase | 10 |

FIG. 8

| Deterioration level | Threshold 1 rank (1: Much frequent, 8: Less frequent) | Threshold 2 rank (1: Much frequent, 8: Less frequent) |
|---|---|---|
| 20000 | 1 | 1 |
| 17500 | 2 | 2 |
| 15000 | 3 | 3 |
| 12500 | 4 | 4 |
| 10000 | 5 | 5 |
| 7500 | 6 | 6 |
| 5000 | 7 | 7 |
| 2500 | 8 | 8 |
| 0(Operating life) | - | - |

800a  800b  800c  800

Refresh target queue

Block information

FIG. 14

| bit byte | 7 | 6 | 5 | 4 | 3 | 2 | 1 | 0 |
|---|---|---|---|---|---|---|---|---|
| 0 | Valid | Response Code | | | | | | |
| 1 | Segment Number | | | | | | | |
| 2 | Filemark | EOM | ILI | Reserved | Sense Key = 01H | | | |
| 3-6 | Information | | | | | | | |
| 7 | Additional sense length | | | | | | | |
| 8-11 | Command specific information | | | | | | | |
| 12 | Additional sense code = DBH | | | | | | | |
| 13 | Additional sense qualifier = 01H or 02H | | | | | | | |
| 14 | Field replaceable unit code | | | | | | | |
| 15 | SKSV | Sense key specific | | | | | | |
| 16 | Sense key specific | | | | | | | |
| 17 | Sense key specific | | | | | | | |
| 18 | Additional sense bytes | | | | | | | |

Read disturb Log Page                              1501

| bit byte | 7 | 6 | 5 | 4 | 3 | 2 | 1 | 0 |
|---|---|---|---|---|---|---|---|---|
| 0 | DS | SPF | PAGE CODE (DBh) | | | | | |
| 1 | SUBPAGE CODE (00h) | | | | | | | |
| 2 | (MSB) | PAGE LENGTH (n-3) | | | | | | |
| 3 | | | | | | | | (LSB) |
| 4 | (MSB) | Number of read disturb LBA information items (m+1) | | | | | | |
| 5 | | | | | | | | (LSB) |
| 6 | Reserved | | | | | | | |
| 7 | Reserved | | | | | | | |
| . . | . | | | | | | | |
| 15 | Reserved | | | | | | | |
| . . | Read disturb LBA information[0] | | | | | | | |
| . . | Read disturb LBA information[1] | | | | | | | |
| . . | . | | | | | | | |
| n | Read disturb LBA information[m] | | | | | | | |

FIG. 15B

Read disturb LBA information                       1502

| bit byte | 7 | 6 | 5 | 4 | 3 | 2 | 1 | 0 |
|---|---|---|---|---|---|---|---|---|
| 0 | LBA | | | | | | | |
| 1 | | | | | | | | |
| 2 | | | | | | | | |
| 3 | | | | | | | | |
| 4 | | | | | | | | |
| 5 | | | | | | | | |
| 6 | Reserved | | | | | | | |
| 7 | Reserved | | | | | | | |
| 8 | Reserved | | | | | | | |
| 9 | Reserved | | | | | | | |
| 10 | Reserved | | | | | | | |
| . . | . . | | | | | | | |
| 14 | Reserved | | | | | | | |
| 15 | Flag | | | | | | | |

Cache structure corresponding to read disturb

Cache structure corresponding to read disturb

FIG. 27

| Tier | Name | Performance | Impact of read disturb | Destination higher-level tier | Destination lower-level tier |
|---|---|---|---|---|---|
| 0 | SLC SSD | 1 | 2 | 0 | 3 |
| 1 | MLC SSD(Next generation) | 2 | 4 | 0 | 3 |
| 2 | MLC SSD used as SLC like<br>MLC Device Package<br>MLC SSD | 3 | 3 | 0 | 3 |
| 3 | SAS | 4 | 1(No impact) | 3 | 3 |
| 4 | NL SAS<br>SATA | 5 | 1(No impact) | 4 | 4 |

132a 132b 132c 132d 132e 132f 132

STORAGE SYSTEM WITH FLASH MEMORY, AND STORAGE CONTROL METHOD

TECHNICAL FIELD

The present invention relates to storage control of a storage system having a flash memory, and particularly to read disturb of the storage system.

BACKGROUND ART

NAND flash memory has a characteristic in that, when it is read-accessed intensely, data corruption (read disturb) occurs in pages around a page to be accessed. Such a characteristic is prominent as the flash memory circuit becomes smaller and smaller.

As a way to cope with the occurrence of read disturb, there is known a method for detecting a page in which read disturb has occurred and then moving data of this page to another page.

For example, the number of accesses to a block of a flash memory is counted. When the block is read a certain number of times or more, read access is made to all pages of the block, and then whether read disturb has actually occurred in the pages or not is checked (see Patent Literature 1 and Patent Literature 2, for example).

CITATION LIST

Patent Literature

[PTL 1]
Japanese Patent Application Publication No. 2008-287404
[PTL 2]
Japanese Patent Application Publication No. 2009-87509

SUMMARY OF INVENTION

Technical Problem

In recent flash memory packages with enterprise-class flash memories, the number of managed blocks under control has been increasing. One of the problems with the application of the method described in Patent Literature 1 or Patent Literature 2 is that a counter needs to be provided in order to count the number of times each block is read, increasing the memory capacity requirements.

Furthermore, because it is not financially realistic to provide the counter to a high-speed memory, the counter is usually provided in a low-speed memory. The problem in this case, however, is the speed of access to the counter, which might degrade the performance of a read process. This problem is becoming severe in the enterprise-class flash memories.

Meanwhile, as one means to cope with the occurrence of read disturb, the page with read disturb can be moved to another page. However, moving data between pages in a flash memory lowers the operating life and performance of the flash memory. For this reason, the number of times to move data needs to be reduced.

For example, a flash memory package may be provided with a cache memory in order to avoid the occurrence of read disturb. However, it is ineffective and costly to provide the flash memory with a cache memory having a sufficient capacity, with the increasing storage capacity of the flash memory.

Normally, the flash memory package allocates a certain physical address in response to an access from a higher-level device. When the physical address is accessed frequently, read disturb occurs in a block corresponding to the physical address. Thus, the contents of the block need to be moved to another block. However, even if the contents of the block are moved to another block, read disturb is still likely to occur in the destination block in the future, as long as a certain specific logical address allocated to the block is frequently accessed. This means that read disturb may still occur in the future even in a block that has been moved. In other words, moving data of a block to another block is not enough to radically prevent the occurrence of read disturb.

Therefore, reading the block to which the certain specific logical address is allocated needs to be inhibited in order to radically prevent the occurrence of read disturb. There is known a read cache as a way to cope with this problem.

In a conventional read cache method, when the same data are accessed intensely within a short period of time and a cache always has data stored therein, the cache is hit. Thus, reading is not executed on the flash memory, preventing the occurrence of read disturb. However, when the data are accessed evenly and intermittently at certain intervals, a cache hit is not obtained. As a result, reading is executed on the flash memory, causing read disturb.

The present invention is contrived in view of the problems described above, and an object thereof is to provide a technology to appropriately cope with the occurrence of read disturb.

Solution to Problem

A storage system has: one or more flash memory chips, each of which has a storage region configured by a plurality of blocks; and a device controller that controls access to data corresponding to the storage region of each flash memory chip. The device controller manages for each of the blocks the number of determination readings for determining read disturb on the basis of a read request with respect to data of each block from a higher-level device of the device controller, and, when there is a block in which the number of determination readings becomes equal to or larger than a threshold represented as a standard indicating a predetermined state related to read disturb, transmits, to the higher-level device, notification information that includes information indicating that read disturb of the block enters the predetermined state. The storage system may be a flash memory package described hereinafter, a storage apparatus including a flash memory package and a storage controller, a system including a storage apparatus and a host apparatus, or a system including a flash memory package and a host apparatus (e.g., a personal computer).

BRIEF DESCRIPTION OF DRAWINGS

FIG. 7A is a diagram showing a configuration example of a first deterioration level subtraction point table according to a modification. FIG. 7B is a diagram showing a configuration example of a second deterioration level subtraction point table according to a modification.

FIG. 8 is a diagram showing a configuration example of a deterioration level threshold rank correspondence table according to the embodiment.

FIG. 14 is a diagram showing a configuration example of a request sense format according to the embodiment.

FIG. 15A is a diagram showing a configuration example of a read disturb log page according to the embodiment. FIG. 15B is a diagram showing a configuration example of read disturb LBA information according to the embodiment.

FIG. 27 is a diagram showing a configuration example of a tier change table according to the embodiment.

DESCRIPTION OF EMBODIMENTS

Figure 1:
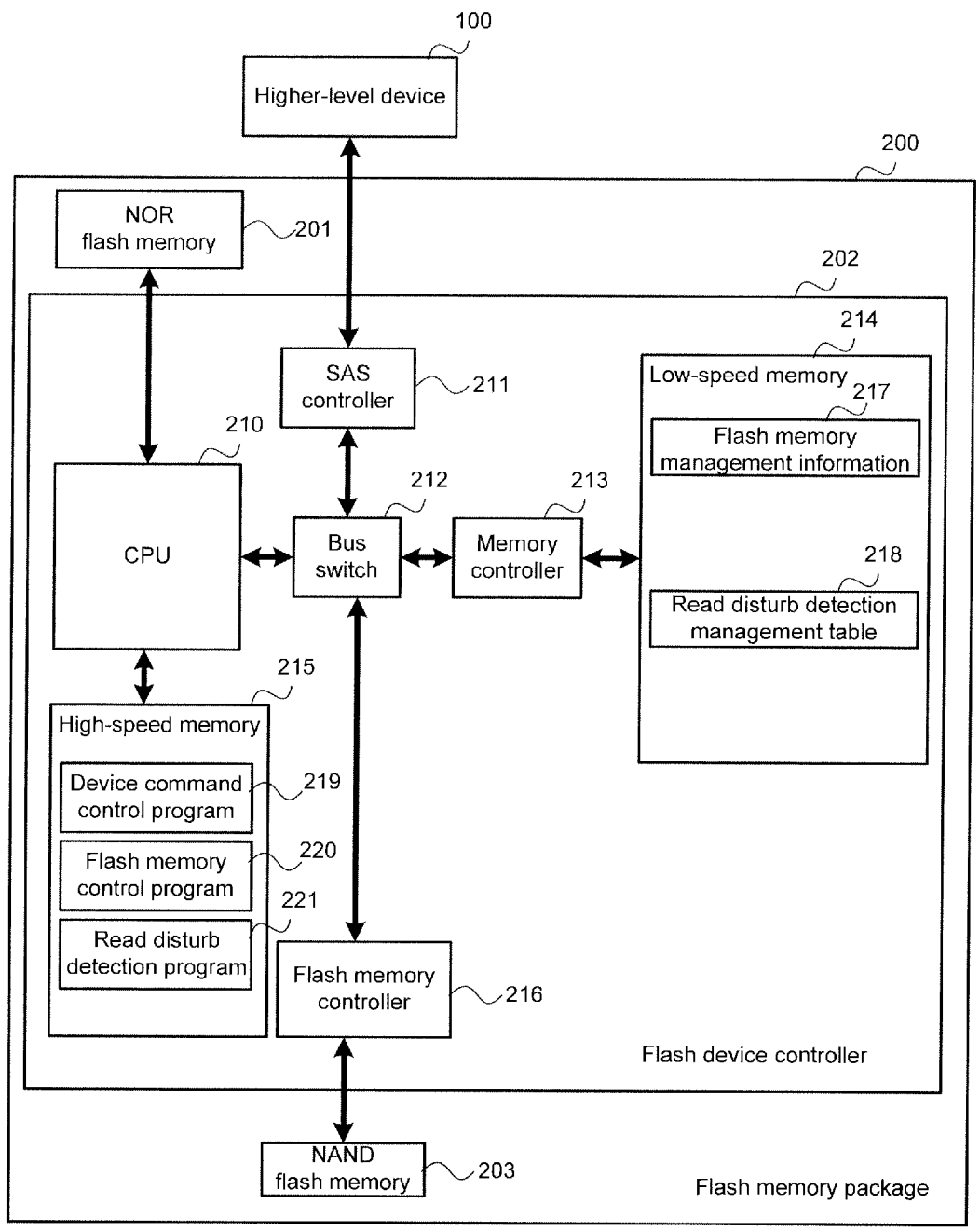
FIG. 1 is a diagram showing a first configuration example of a storage system according to an embodiment.

Embodiments are now described with reference to the drawings. Note that the following embodiments do not limit the invention relevant to the scope of claims. In addition, various elements and all combinations thereof described in the embodiments are not necessarily required in the solution of the present invention.

In the following description, various pieces of information are illustrated in the form of "aaa table" or "aaa chart" but may be illustrated in the form of a data structure other than a table or chart. In order to describe that the various pieces of information are independent of the data structure, "aaa table" or "aaa chart" can be referred to as "aaa information."

Furthermore, in the following description, each process is described using "program" as the subject of the sentence; however, the subject of the sentence describing each process may be "processor", because the program is executed by a processor (e.g., a CPU (Central Processing Unit)) contained in a controller, to perform a defined process by appropriately using at least one of a storage resource (e.g., memory) and a communication interface device (e.g., a SAS controller, a flash memory controller, a host I/F, a backend I/F). The process that is described using "program" as the subject may be performed by the processor, a device having the processor, or a system (e.g., a flash memory package, a disk array, a storage system). The controller may be the processor itself or may include a hardware circuit that partially or entirely carries out a process performed by the controller. The program may be installed from a program source into each controller. The program source may be, for example, a program distribution server or a storage medium.

An outline of an embodiment is now described with reference to FIG. 1.

A flash device controller 202 compares the number of determination readings according to data reading of a block, with a threshold represented as a standard for a predetermined state of read disturb occurring in the block. When the number of determination readings is equal to or greater than the threshold, the flash device controller 202 notifies a higher-level device 100 of that the read disturb occurring in the block enters the predetermined state (that the number of readings is equal to or greater than the threshold). Here, the predetermined state of the read disturb means a state in which read disturb is apt to occur, or a state in which read disturb has occurred. As a result, the higher-level device 100 can execute a process for coping with the read disturb.

The flash device controller 202 does not count the number of determination readings in response to all read requests for a data read performed by the higher-level device 100, but randomly determines a read request related to the number of determination readings that needs to be counted. Thus, compared to when counting the number of readings in response to all the read requests, the number of accesses to a low-speed memory managing the number of determination readings can be reduced.

Furthermore, after being notified by a flash memory package 200 that the read disturb enters the predetermined state, the higher-level device 100 executes a process for coping with the read disturb.

In the process, for example, the higher-level device 100 manages a cache segment on a cache memory 122 such that the cache segment becomes more apt to be resident in the cache memory 122, the cache segment including data of a block in which read disturb is apt to occur or a block in which read disturb has occurred. This can alleviate the situation where the data of the block in which read disturb is apt to occur, is read from the flash memory package 200. As a result, the occurrence of read disturb can be appropriately reduced.

In another process for coping with the read disturb, when chunks including blocks are stored and managed in a plurality of storage tiers corresponding to the types of storage units, the higher-level device 100, in response to the notification of the occurrence of read disturb (the number of determination readings is equal to or larger than the threshold corresponding to the occurrence of read disturb), changes the storage tier that has the chunks including the relevant block with read disturb, to a storage tier that is configured by a storage region of the storage unit in which read disturb does not occur or is less likely to occur. This can appropriately prevent read disturb from occurring as a result of a read process performed on the data of the block.

Furthermore, when a block in which read disturb has occurred is detected (for example, when the number of readings is equal to or larger than the threshold corresponding to the occurrence of read disturb), the flash device controller 202 reads a page of the block in which read disturb has occurred. When the number of ECC (Error Correcting Code) correction bits upon reading is equal to or larger than a predetermined number, the flash device controller 202 moves a page that is considered to induce read disturb (inducing page) on the above mentioned page of the block, to a block that is erased less frequently. Generally, a block that is erased less frequently is resistant to read disturb. For this reason, the occurrence of read disturb therein can be prevented.

Next, the embodiments are described in detail.

FIG. 1 is a diagram showing a first configuration example of a storage system according to an embodiment.

The storage system has the flash memory package 200. The higher-level device 100 may be, for example, a storage controller, which is described hereinafter, or a PC (Personal Computer). The storage system may have the higher-level device 100.

The flash memory package 200 has a NOR flash memory 201, the flash device controller 202, and a NAND flash memory 203.

The NOR flash memory 201 is for storing programs and various pieces of information used by a CPU 210. The NAND flash memory 203 includes one or more NAND flash memory chips. The NAND flash memory chips may be of, for example, SLC (Single Level Cell) type or MLC (Multi Level Cell) type. The NAND flash memory 203 is used for storing various data utilized in the higher-level device 100.

The flash device controller 202 includes the CPU 210, a SAS (Serial Attached SCSI) controller 211, a bus switch 212, a memory controller 213, a low-speed memory 214, a high-speed memory 215, and a flash memory controller 216.

The SAS controller 211 mediates a data communication between the higher-level device 100 and a section on the bus switch 212 side. The SAS controller 211 also performs data communication with the higher-level device 100 in accordance with a SAS. The bus switch 212 is coupled to the CPU 210, the SAS controller 211, the memory controller 213, and the flash memory controller 216, to relay data therebetween.

The memory controller 213 is coupled to the low-speed memory 214 and controls data input to the low-speed memory 214 and data output from the low-speed memory 214.

The low-speed memory 214 is, for example, a DRAM (Dynamic Random Access Memory) or a nonvolatile memory and stores various data and the like that are utilized in processes by the CPU 210. The low-speed memory 214 stores flash memory management information 217 and a read disturb detection management table 218.

The flash memory management information 217 stores information required for managing the NAND flash memory 203. The read disturb detection management table 218 stores the number of readings for determining read disturb (the number of determination readings) for each of blocks of the NAND flash memory 203. The read disturb detection management table 218 is described hereinafter in more detail.

The high-speed memory 215 is, for example, a SRAM (Static Random Access Memory) and coupled directly to the CPU 210. The high-speed memory 215 stores the programs and the like used by the CPU 210. In the present embodiment, the high-speed memory 215 stores a device command control program 219, a flash memory control program 220, and a read disturb detection program 221.

The device command control program 219 is a program for receiving and executing a command from the higher-level device 100. The flash memory control program 220 executes various processes as for the NAND flash memory 203. The read disturb detection program 221 operates as a sub-program of the flash memory control program 220 and detects that read disturb is apt to occur or has occurred in the blocks of the NAND flash memory 203. When it is detected that read disturb is apt to occur or has occurred, the flash memory control program 220 uses the device command control program 219 to notify the higher-level device 100 of such detection.

The flash memory controller 216 is coupled to the NAND flash memory 203 to control data input/output to/from the NAND flash memory 203. The CPU 210 performs various processes by executing the programs stored in the high-speed memory 215.

Figure 2:
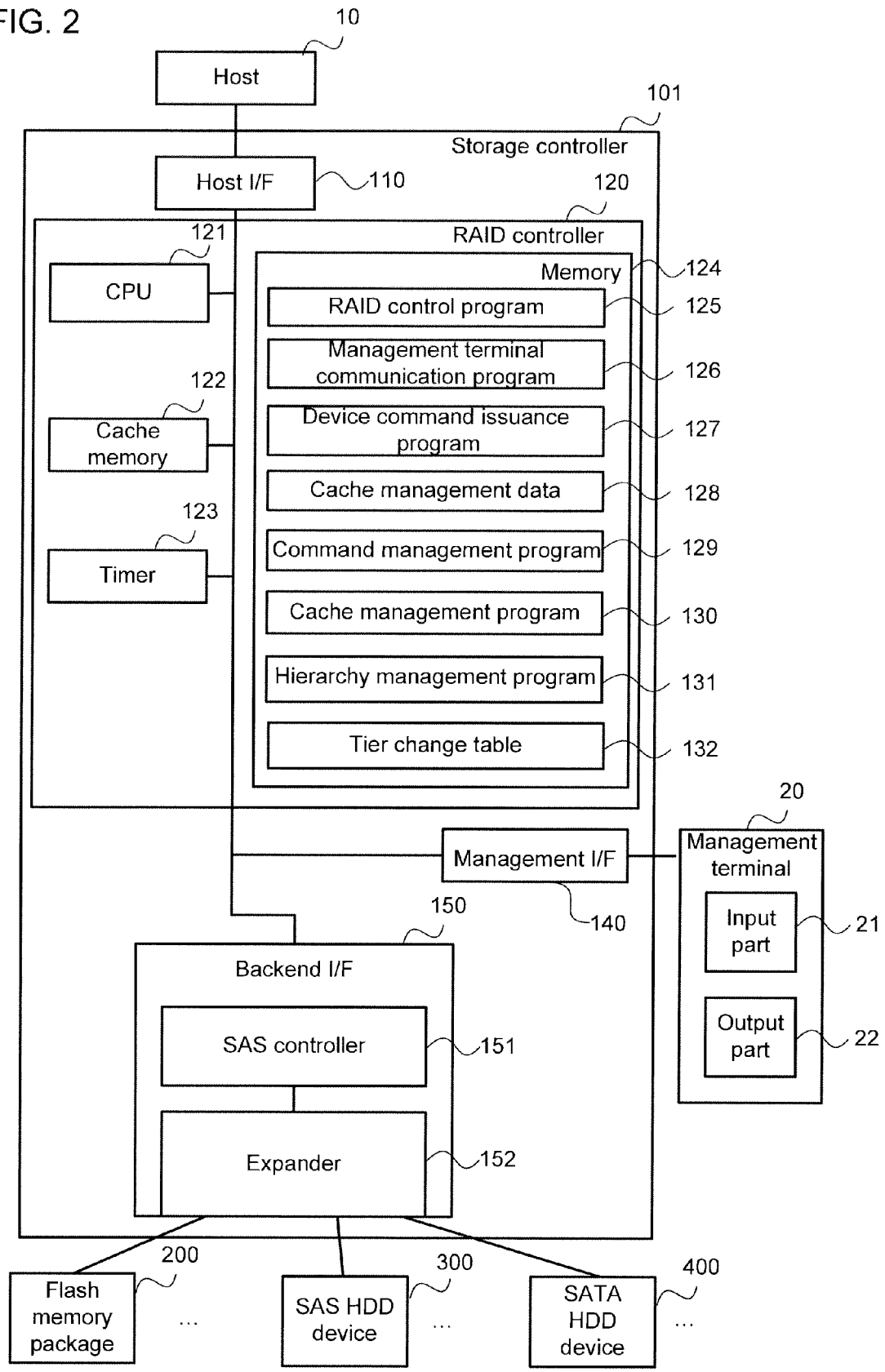
FIG. 2 is a diagram showing a second configuration example of the storage system according to the embodiment.

FIG. 2 is a diagram showing a second configuration example of the storage system according to the embodiment. The configuration diagram of FIG. 2 shows the higher-level device 100 of the storage system of FIG. 1 as a storage controller 101.

The storage system is a storage apparatus, which has the storage controller 101 serving as an example of the higher-level device 100, the flash memory package 200, a SAS HDD device 300, and a SATA (Serial ATA) HDD device 400. There may be one or more flash memory packages 200, SAS HDD devices 300, and SATA HDD devices 400. The storage system may include a host 10 and a management terminal 20. The host 10 inputs/outputs, to/from the storage controller 101, data used in processes. The management terminal 20 is configured by, for example, a PC and has an input part 21 that receives input from a manager, and an output part 22 that displays an output to the manager.

The storage controller 101 has a host interface (host I/F) 110, a RAID (Redundant Array of Independent (or Inexpensive) Disks) controller 120, a management interface (management I/F) 140, and a backend interface (back end I/F) 150.

The host I/F 110 mediates an exchange of data between the host 10 and the storage controller 101. The management I/F 140 mediates an exchange of data between the management terminal 20 and the storage controller 101. The backend I/F 150 mediates an exchange of data among the flash memory package 200, the SAS HDD device 300, the SATA HDD device 400 and the like. The backend I/F 150 has a SAS controller 151 and an expander 152. The expander 152 can be coupled to a plurality of storage units (200, 300, 400 etc.) and mediates an exchange of data between the SAS controller 151 and each storage unit. The SAS controller 151 performs data communication with each storage unit in accordance with the SAS.

The RAID controller 120 performs control for accessing the storage units (200, 300, 400) from the host 10. The RAID controller 120 includes a CPU 121, the cache memory 122, a timer 123, and a memory 124. The cache memory 122 caches data that are input/output to/from the storage units (200, 300, 400). The timer 123 measures a lapse of time. The CPU 121 executes various processes by utilizing programs and data stored in the memory 124.

The memory 124 stores the programs executed by the CPU 121 and the data used by the CPU 121. In the present embodiment, the memory 124 stores a RAID control program 125, a management terminal communication program 126, a device command issuance program 127, cache management data 128, a command management program 129, a cache management program 130, a hierarchy management program 131, and a tier change table 132.

The RAID control program 125 performs RAID control in the storage units (200, 300, 400 etc.). The management terminal communication program 126 communicates with the management terminal 20. The device command issuance program 127 performs a process for issuing various commands to the storage units (200, 300, 400). The command management program 129 manages command execution and command reception and performs a resultant determination process or a process according to a result. For example, the command management program 129 counts and manages the number of accesses to a specific address. Furthermore, when being notified by a lower-level device (storage unit) of a status related to read disturb, the command management program 129 reflects the notification in the cache management data 128 and performs an operation that serves as a trigger to change the tiers by performing hierarchical management.

The cache management program 130 manages creation and destruction of cache data based on the cache management data 128. The cache management program 130 performs to associate management information of a cache segment as a segment of a block in which read disturb has occurred, and performs a queue management operation based on the association in accordance with a request of the command management program 129.

The hierarchy management program 131 manages a hierarchical structure of a storage region configured by the storage regions of the plurality of storage units (200, 300, 400). The hierarchy management program 131 performs a process for changing a hierarchy (tiers) in which data are arranged, in accordance with access frequencies to the data. The hierarchy management program 131 also performs a process to change a tier that have data in consideration of read disturb.

The cache management data 128 are data for managing cache information and configured by queue information and segment information (a cache segment 2001). The tier change table 132 stores data used for changing the tiers in consideration of read disturb. The details are to be explained later.

Figure 3:
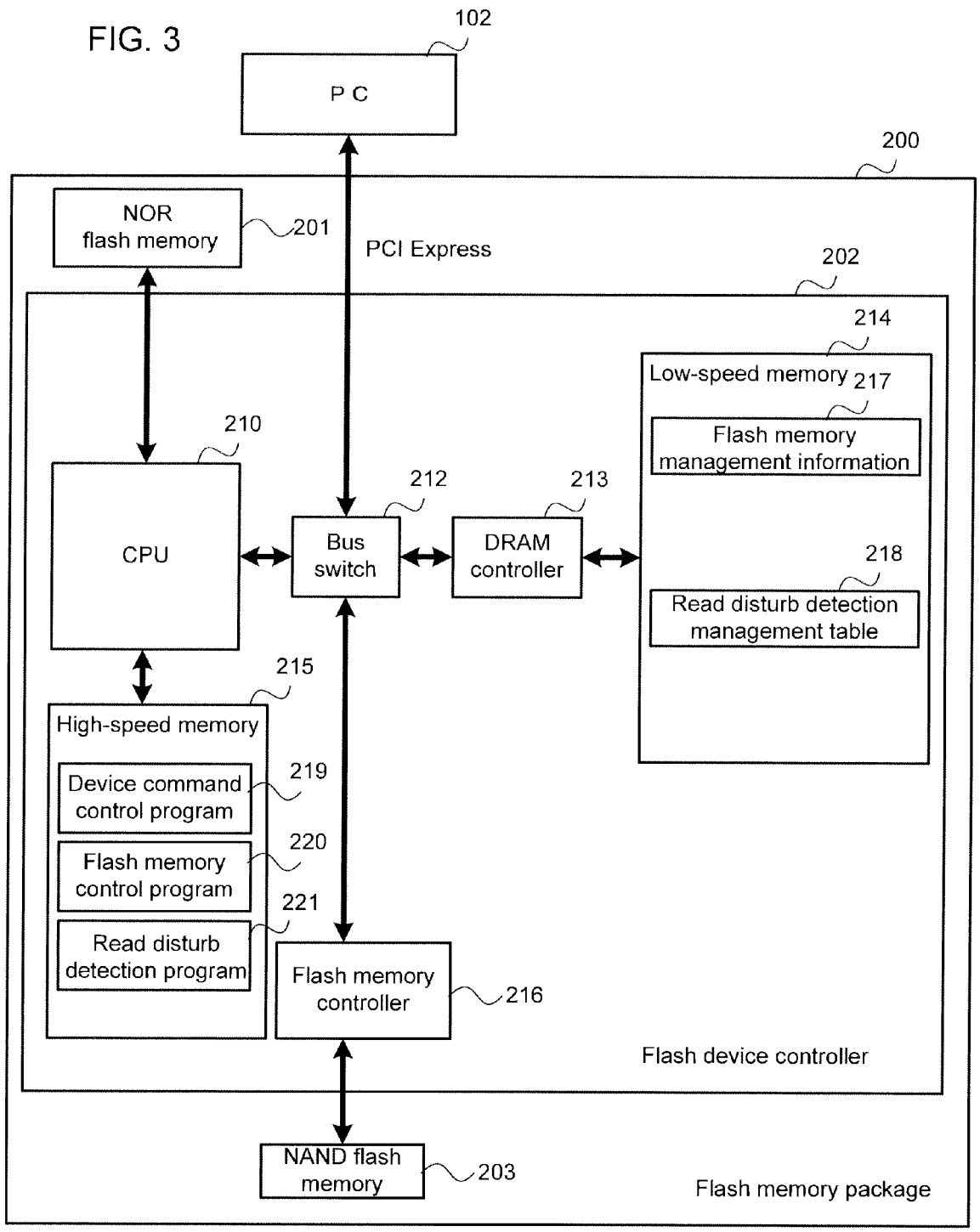
FIG. 3 is a diagram showing a configuration example of a storage system according to a modification.

FIG. 3 is a diagram showing a configuration example of a storage system according to a modification. The configuration diagram of FIG. 3 shows the higher-level device 100 of the storage system of FIG. 1 as a PC 102.

When the higher-level device 100 is the PC 102 in the storage system, the PC 102 may be coupled to the bus switch 212 of the flash memory package 200 by, for example, a PCI Express. The storage system may or may not include the PC 102.

Next, the occurrence of read disturb in the NAND flash memory 203 is described briefly.

Figure 4A:
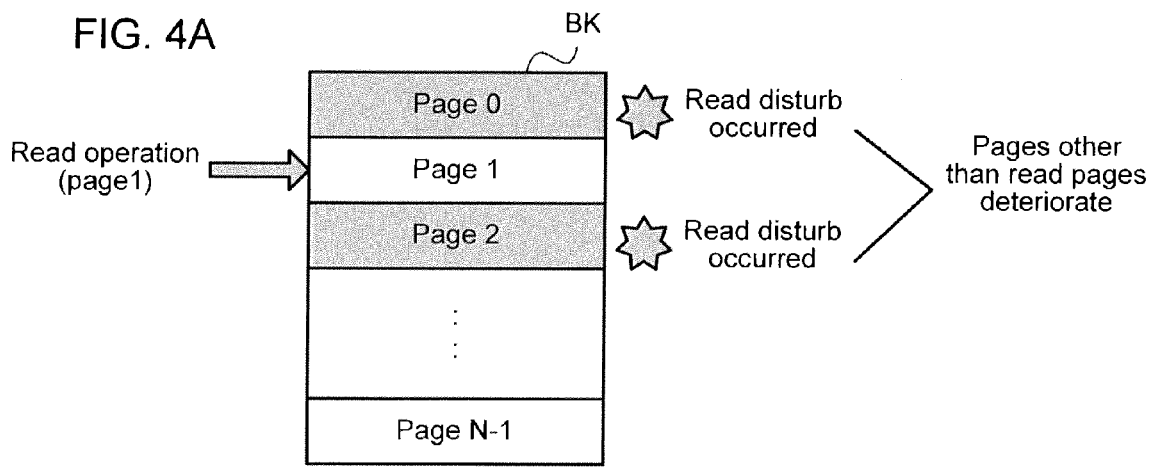
FIG. 4A is a diagram explaining a first example of an occurrence of read disturb.
Figure 4B:
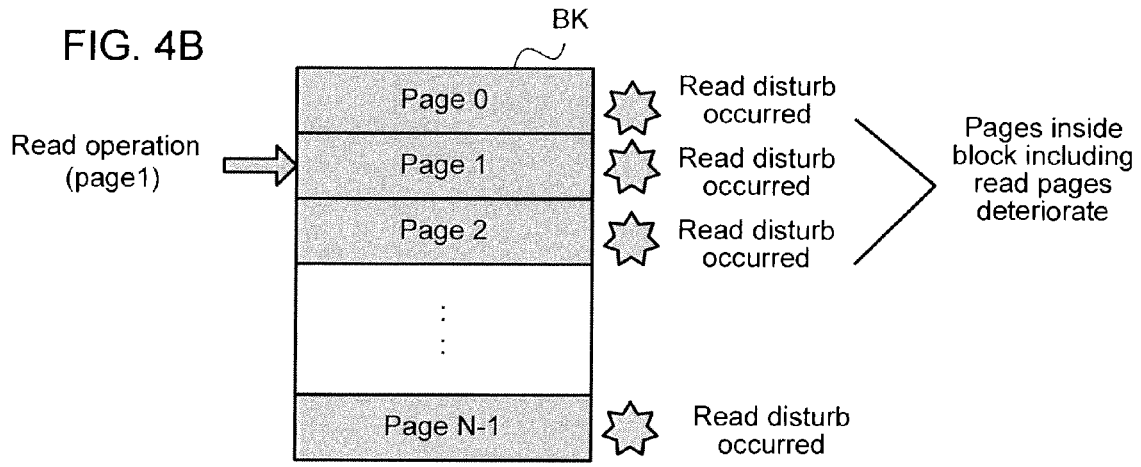
FIG. 4B is a diagram explaining a second example of an occurrence of read disturb.

FIG. 4A is a diagram explaining a first example of the occurrence of read disturb. FIG. 4B is a diagram explaining a second example of a occurrence of read disturb.

When a page 1 of a certain block BK of the NAND flash memory 203 is read a number of times, for example, read disturb might occur in pages (page 0, page 2 in this example) around the read page 1 as shown in FIG. 4A, or read disturb might occur in other pages (page 0, page 1, page 2, page N−1, etc. in this example) of the same block BK, including the read page 1, as shown in FIG. 4B. In this manner, read disturb occurs in the pages other than the read page of the same block BK. The pages shown in FIGS. 4A and 4B in which read disturb occurs are merely examples and pages in which read disturb occurs are depend on the configuration and the like of the NAND flash memory 203.

Figure 5:
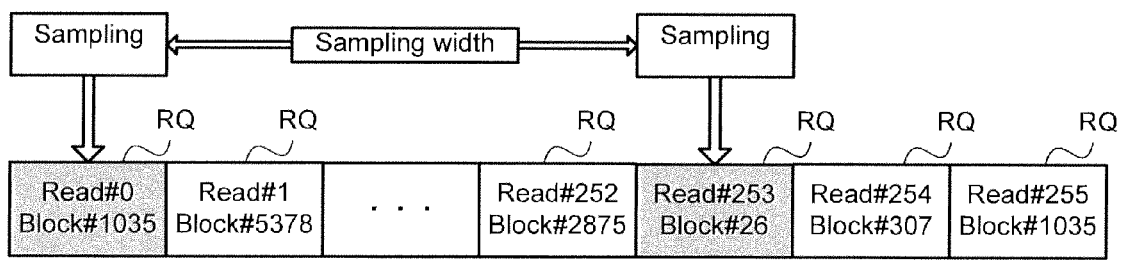
FIG. 5 is a diagram explaining an example of sampling of a read request with respect to a block, according to the embodiment.

FIG. 5 is a diagram explaining an example of sampling of a read request with respect to a block, according to the embodiment.

The CPU 210 of the flash device controller 202 does not count the number of readings on a target block in response to all of generated read requests from the higher-level device 100, but counts the number of readings (the number of determination readings) on the target block that is obtained as a target to be subject to read count, as result of omitting the generated read requests. Because not all of the read requests are taken into consideration, it is not necessary to access the low-speed memory 214 to manage the number of readings every time a read request is received. Therefore, the impact of the flash memory package 200 on the I/O performance can be reduced appropriately.

In the present embodiment, the CPU 210 determines a sampling width (the number of read requests)(in other words, sampling interval) between a read request to be sampled and the next read request to be sampled, based on a random number equal to or less than a predetermined number (e.g., 255). The reason that the sampling width is determined based on the random number is because when, for example, the sampling width is constant, there is a possibility that the read requests that are generated with a certain period are not sampled at all or are always sampled.

The reason that the read requests may be omitted to count the number of determination readings is because, considering that a significant number of read requests are generated to cause read disturb in a block, a sufficient number or more of the determination readings can be obtained statistically from the block in which read disturb has occurred. Therefore, when the number of determination readings exceeds a predetermined threshold, the occurrence of read disturb in the relevant block can be determined properly.

Figure 6:
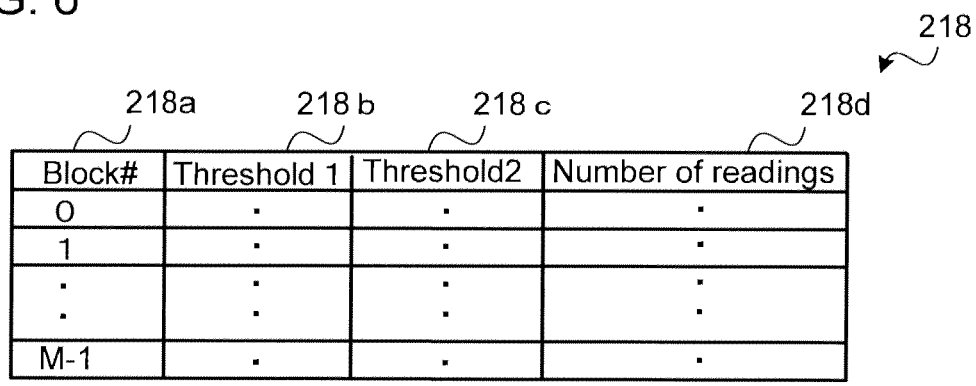
FIG. 6 is a diagram showing a configuration example of a read disturb detection management table according to the embodiment.

FIG. 6 is a diagram showing a configuration example of the read disturb detection management table according to the embodiment.

The read disturb detection management table 218 is a table for managing the number of determination readings counted by the CPU 210, and stores records having fields for a block number (block #) 218a, a threshold 1 218b, a threshold 2 218c, and the number of readings 218d.

The block number 218 stores a block number for uniquely identifying a block. The threshold 1 218b stores a threshold (threshold 1) with respect to the number of determination readings that is obtained when it can be determined that read disturb is about to occur in a relevant block (read disturb is apt to occur). The threshold 2 218c stores a threshold (threshold 2) with respect to the number of determination readings that is obtained when it can be determined that read disturb has occurred in the relevant block. The number of readings 218d stores the number of determination readings with respect to the relevant block.

Note in FIG. 6 that the threshold 1 and the threshold 2 are managed with respect to each block, but the present invention is not limited to this configuration. Thus, the threshold 1 and the threshold 2 that are common to each block may be managed.

On account of block deterioration, the thresholds of each block may be determined as follows, in order to improve the determination accuracy by making the thresholds different from each other when determining the occurrence of read disturb.

It is preferred that a PE interval or the number of PEs be taken into consideration when deciding the thresholds to determine the occurrence of read disturb. The PE interval here means a time interval between completion of a program performed on a block and erasing the block. The number of PEs means the number of times that the block is erased (the number of erasing times).

Here, a deterioration level is used as an indicator of a deterioration of each block. The deterioration level is a predetermined default value (e.g., 20,000 points) when a block is in an initial state, and is lowered according to the PE interval. Note that the deterioration level may be updated not only using a subtraction method but also using, for example, an addition method where a value according to the PE interval is added to a predetermined default value (0, for example). When the deterioration level of a block is zero, it means that the block reaches the end of its usefulness. The default value may be changed by a manufacturer of the flash memory chips or a process for manufacturing the flash memory chips.

In addition, regarding the number of PEs, the higher the number of PEs, the greater the deterioration, and therefore the more points are subtracted from the deterioration level in the same PE interval. A deterioration level subtraction point table used for lowering the deterioration level is illustrated hereinafter. The deterioration level subtraction point table is stored in, for example, the low-speed memory 214.

FIG. 7A is a diagram showing a configuration example of a first deterioration level subtraction point table according to a modification. FIG. 7B is a diagram showing a configuration example of a second deterioration level subtraction point table according to a modification. FIG. 7A shows a deterioration level subtraction point table for a block having less than 3000 PEs, and FIG. 7B shows a deterioration level subtraction point table for a block having 3000 or more PEs.

A deterioration level subtraction point table 700 (701) has fields for a PE interval 700a (701a) and deterioration level subtraction point 700b (701b). The PE interval 700a (701a) stores the PE interval. The deterioration level subtraction point 700b (701b) stores subtraction points of a deterioration level of a relevant PE interval. For example, the record described at the top of the deterioration level point table 700 shows that 40 points are subtracted when the PE interval is six minutes or less. In the deterioration level subtraction point tables 700, 701, the longer the PE intervals, the less points are subtracted, and the higher the number of PEs, the more points are subtracted even in the same PE interval. Note that the two deterioration level subtraction point tables 700, 701 are illustrated as examples, but more of the deterioration level subtraction point tables corresponding to the number of PEs may be prepared when controlling the deterioration levels in more detail.

In a process for calculating the deterioration level of a block, the CPU 210 determines the deterioration level subtraction point table to be used, based on the number of PEs of the block, selects a subtraction point corresponding to the PE interval from the determined deterioration level subtraction point table, and subtracts the subtraction point from the deterioration level of the block, to calculate the deterioration level of the block at that particular moment. After calculating the deterioration level, a corresponding threshold is specified by using a deterioration level threshold rank correspondence table described hereinafter.

FIG. 8 is a diagram showing a configuration example of the deterioration level threshold rank correspondence table according to the embodiment.

A deterioration level threshold rank correspondence table 800 has fields for a deterioration level 800a, a threshold rank 800b, and a threshold 2 rank 800c. The deterioration level 800a stores the deterioration level of each block. The threshold 1 rank 800b stores a rank that indicates the number of occurrences of the threshold 1 of the block having the relevant deterioration level. Here, rank 1 indicates the highest number of occurrences, and the number of occurrences becomes lower and lower as the rank approaches rank 8. Note that the value of the threshold is associated to each corresponding rank and managed. The threshold 2 rank 800c stores a rank that indicates the number of occurrences of the threshold 2 of the block having the relevant deterioration level. Here, rank 1 indicates the highest number of occurrences, and the number of occurrences becomes lower and lower as the rank approaches rank 8. Note that the values of the thresholds are associated to each corresponding rank and managed. Regarding the same rank, the number of occurrences of the threshold 2 is higher than the number of occurrences of the threshold 1. The deterioration level threshold rank correspondence table 800 may store the values of the thresholds themselves instead of storing the ranks. In this example, each threshold applies when a read request is sampled and the number of determination readings is counted; however, for instance, a threshold that applies when counting all read requests may be stored, and, based on this threshold, a threshold that applies when sampling a read request and counting the number of determination readings may be calculated.

In a process for specifying a threshold value from a deterioration level, the CPU 210 selects ranks of the threshold 1 and the threshold 2 corresponding to a deterioration level calculated based on the deterioration level threshold rank correspondence table 800, and acquires the values of thresholds (the number of occurrences) corresponding to the selected ranks. Through this process, the CPU 210 can specify the thresholds corresponding to each block.

Next is described a read disturb detection process performed by the flash memory package 200 according to the present embodiment.

Figure 9:
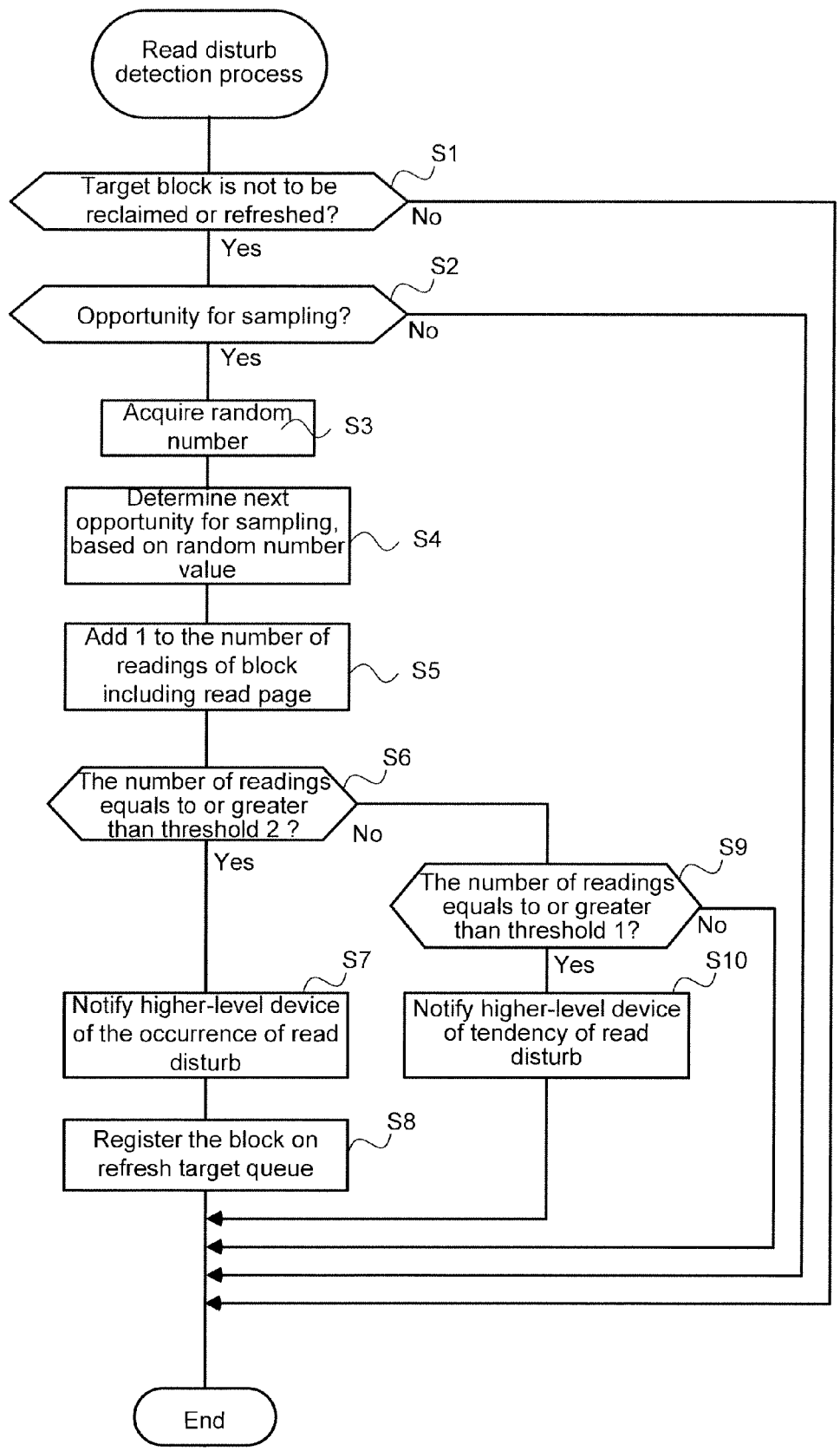
FIG. 9 is a flowchart showing an example of a read disturb detection process according to the embodiment.

FIG. 9 is a flowchart showing an example of the read disturb detection process according to the embodiment.

The read disturb detection process is executed each time when the flash memory package 200 receives a read request from the higher-level device 100. First, the CPU 210 determines whether or not a target block related to a read request is a block to be reclaimed or refreshed (step S1). When the block is to be reclaimed or refreshed (No in step S1), the block is to be moved, and there is no point in detecting the occurrence of read disturb. Therefore, the CPU 210 ends the process.

When, however, the block is not to be reclaimed or refreshed (Yes in step S1), the CPU 210 determines whether the read request is sampled or not (step S2). When the read request is not sampled (No in step S2), the CPU 210 ends the process. In this manner, when the read request is not sampled, a process for counting the number of readings is not performed, reducing the processing load.

When, on the other hand, the read request is sampled (Yes in step S2), the CPU 210 acquires random numbers (step S3), and determines, based on the random number values, next opportunity for sampling a read request (step S4).

Subsequently, the CPU 210 adds 1 to the number of determination readings of the block including read pages (step S5), acquires the threshold 2 associated to the block from the read disturb detection management table 218, and determines whether the number of determination readings is equal to or greater than the threshold 2 (step S6). When the number of determination readings is equal to or greater than the threshold 2 (Yes in step S6), it can be determined that read disturb has occurred in the block. Therefore, the CPU 210 notifies the higher-level device 100 of the occurrence of read disturb (step S7), registers the block in a refresh target queue of the low-speed memory 214 (step S8), and ends the process. Note that the block registered in the refresh target queue is refreshed subsequently.

However, when the number of determination readings is not equal to or greater than the threshold 2 (that is, the number of determination readings is less than the threshold 2) (No in step S6), the CPU 210 determines whether the number of determination readings is equal to or greater than the threshold 1 corresponding to the block, which is acquired from the read disturb detection management table 218 (step S9). When the number of determination readings is equal to or greater than the threshold 1 (Yes in step S9), it means that read disturb is about to occur in this block (read disturb is apt to occur in this block). Thus, the CPU 210 notifies the higher-level device 100 of the fact that read disturb is about to occur (step S10), and ends the process.

On the other hand, when the number of determination readings is not equal to or greater than the threshold 1 (that is, the number of determination readings is less than the threshold 1)(No in step S9), it means that read disturb does not or is not apt to occur in the block. Therefore, the CPU 210 ends the process.

Figure 10:
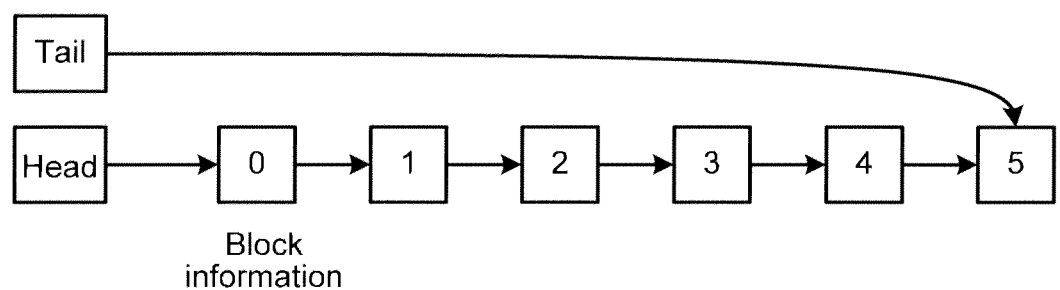
FIG. 10 is a diagram explaining an example of a refresh target queue according to the embodiment.

FIG. 10 is a diagram explaining an example of the refresh target queue according to the embodiment.

The refresh target queue is managed in the low-speed memory 214. The refresh target queue has a head indicating the top of the queue and a tail indicating the end of the queue. The head is coupled to block information of a block to be refreshed (block 0, in this case). Block information of a block to be refreshed next is coupled to the block information of the block 0. Block information items of the blocks to be refreshed are coupled in the same manner. Block information of a block to be refreshed at the end is coupled from the tail.

For instance, when registering a new block in the refresh target queue in step S8, the CPU 210 couples block information of the new block to the block information of the last block coupled to the tail, and further couples the block information of the new block to the tail.

Next is described a process operation related to refreshing performed in the flash memory package 200. Here, refreshing means rewriting valid data of a certain block into another block. The process related to the refreshing includes a refresh target check process that is executed periodically on a polling cycle 1, and a refresh implementation process that is executed periodically on a polling cycle 2.

Figure 11A:
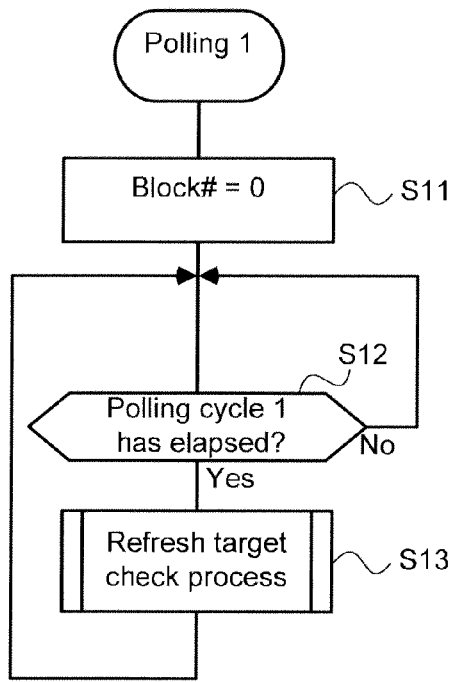
FIG. 11A is a flowchart of an example of a polling 1 process according to the embodiment.
Figure 11B:
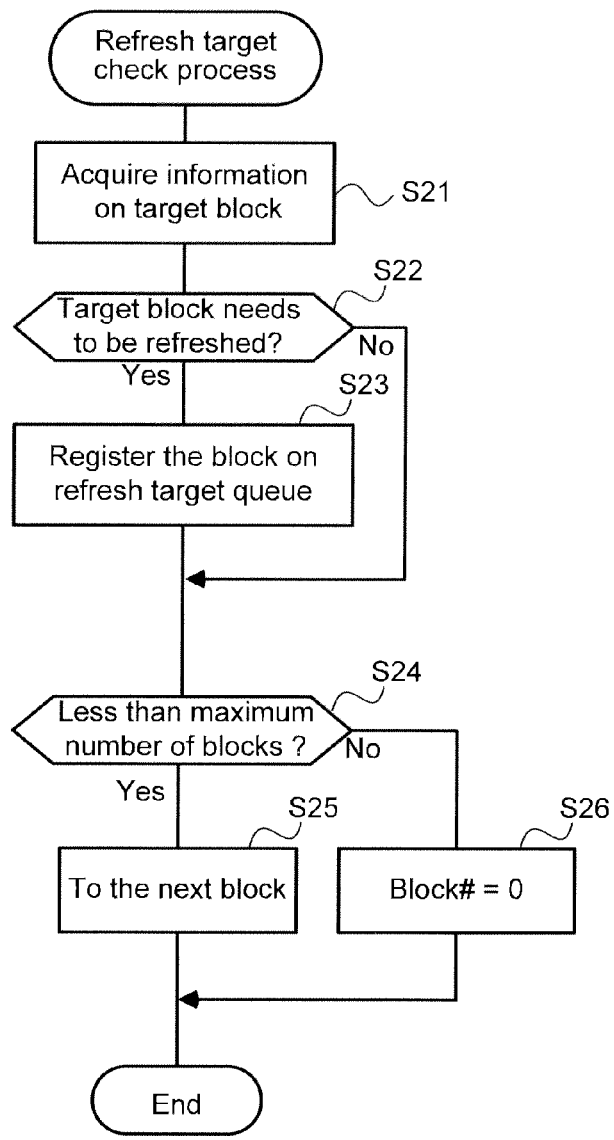
FIG. 11B is a flowchart of an example of a refresh target check process according to the embodiment.

FIG. 11A is a flowchart of an example of a polling 1 process according to the embodiment. FIG. 11B is a flowchart of an example of the refresh target check process according to the embodiment.

In the polling 1 process, the CPU 210 sets the block number (#) to 0 (step S11), and determines whether the polling cycle 1 in which the refresh target check process is performed has elapsed or not (step S12). When the polling cycle 1 has not yet elapsed (No in step S12), the CPU 210 waits until the polling cycle 1 elapses. When the polling cycle 1 has elapsed (Yes in step S12), the CPU 210 executes the refresh target check process (FIG. 11B) (step S13) and proceeds to step S12.

In the refresh target check process, the CPU 210 acquires information on a target block (refresh execution date, etc.) (step S21), and determines whether the block should be refreshed or not (step S22). For example, when predetermined days have elapsed since the refresh execution date, the CPU 210 may determine that the block should be refreshed.

When it is determined that the block should be refreshed (Yes in step S22), the CPU 210 registers the block in the refresh target queue (step S23) and proceeds to step S24. When it is determined that the block should not be refreshed (No in step S22), the CPU 210 proceeds to step S24.

In step S24, the CPU 210 determines whether or not the target block has a block number less than a maximum block # (step S24). When the block number of the target block is less than the maximum block # (Yes in step S24), the CPU 210 sets the block # to a subsequent block number (step S25), and ends the process. However, when the block number of the target block is not less than the maximum block # (that is, the block number of the target block is equal to or larger than the maximum block #) (No in step S24), the CPU 210 sets the block # to 0 (step S26), and then ends the process.

Figure 12A:
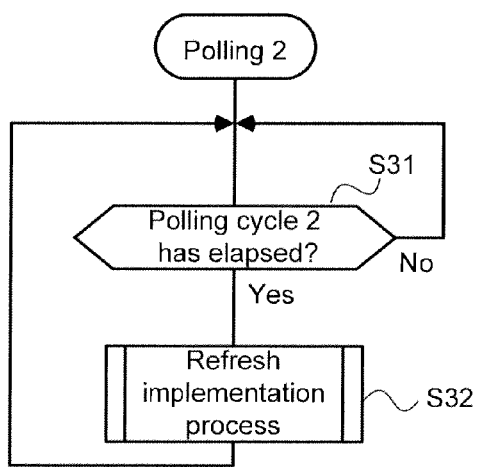
FIG. 12A is a flowchart of an example of a polling 2 process according to the embodiment.
Figure 12B:
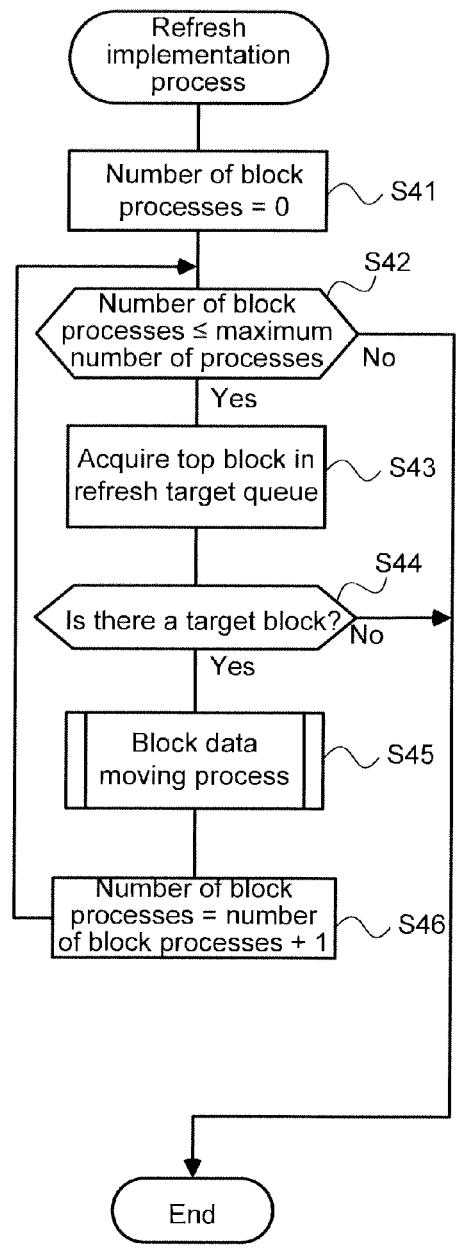
FIG. 12B is a flowchart of an example of a refresh implementation process according to the embodiment.

FIG. 12A is a flowchart of an example of a polling 2 process according to the embodiment. FIG. 12B is a flowchart of an example of the refresh implementation process according to the embodiment of the present invention.

In the polling 2 process, the CPU 210 determines whether the polling cycle 2 in which the refresh implementation process is performed has elapsed or not (step S31). When the polling cycle 2 has not yet elapsed (No in step S31), the CPU 210 waits until the polling cycle 2 elapses. However, when the polling cycle 2 has elapsed (Yes in step S31), the CPU 210 executes the refresh implementation process (FIG. 12B) (step S32) and proceeds to step S31.

In the refresh implementation process, the CPU 210 sets the number of block processes to 0 (step S41), and determines whether the number of block processes is equal to or less than the maximum number of processes or not (step S42). When the number of block processes is equal to or less than the maximum number of processes (Yes in step S42), the CPU 210 acquires the top block of the refresh target queue (step S43).

Next, when the refresh target queue has a target block (Yes in step S44), the CPU 210 executes a block data moving process (FIG. 13) (step S45), adds 1 to the number of block processes (step S46), and proceeds to step S42.

On the other hand, when the number of block processes is not equal to or less than the maximum number of processes (that is, the number of block processes is larger than the maximum number of processes) (No in step S42) or when the refresh target queue does not have a target block (No in step S44), the CPU 210 ends the process.

Figure 13:
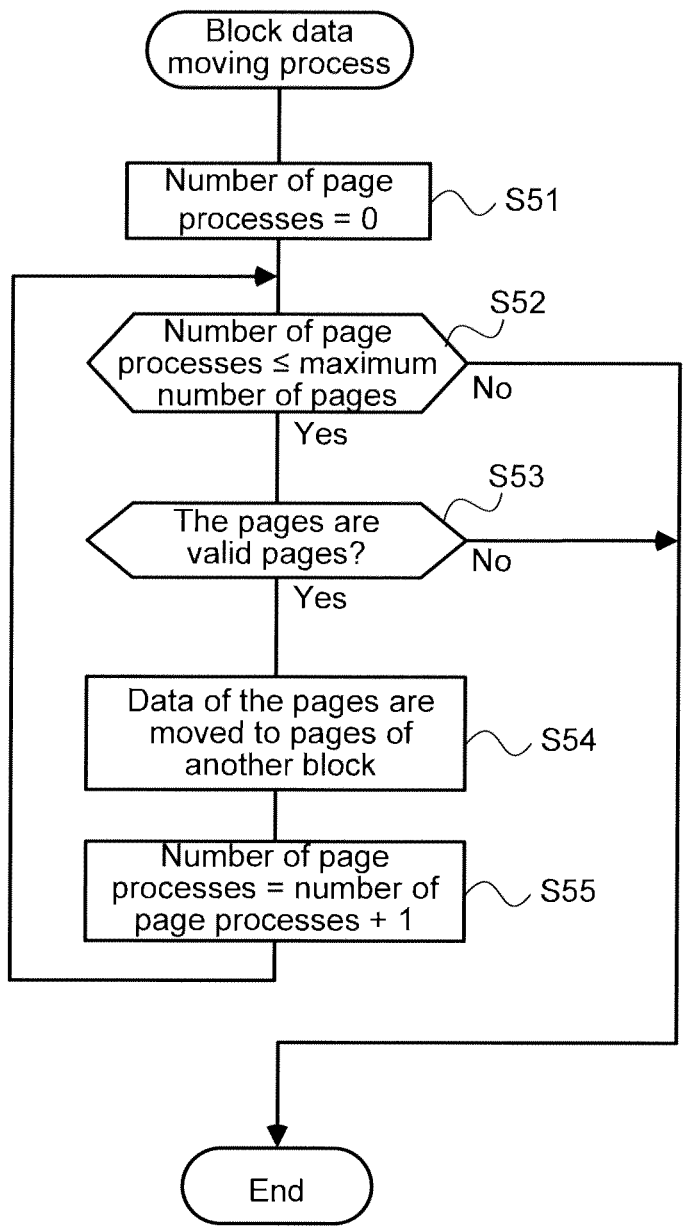
FIG. 13 is a flowchart of an example of a block data moving process according to the embodiment.

FIG. 13 is a flowchart of an example of the block data moving process according to the embodiment.

In the block data moving process, the CPU 210 sets the number of page processes to 0 (step S51), and determines whether the number of page processes is equal to or less than the maximum number of pages or not (step S52). When the number of page processes is equal to or less than the maximum number of pages as a result of the determination (Yes in step S52), the CPU 210 determines whether the pages are valid or not (step S53).

When the pages are determined to be valid as a result of the determination (Yes in step S53), the CPU 210 moves the data of the pages to pages of another block (step S54), adds 1 to the number of page processes (step S55), and proceeds to step S52.

However, when the number of page processes is not equal to or less than the maximum number of pages (that is, the number of page processes is larger than the maximum number of pages) (No in step S52), and when the pages are not valid (No in step S53), the CPU 210 ends the process.

Next is described in detail a method where the CPU 210 of the flash memory package 200 sends notifications to the higher-level device 100 (steps S7, S10 shown in FIG. 9).

In a first method where the CPU 210 sends notifications to the higher-level device 100, the CPU 210 may include in a request sense format a determination code that indicates that read disturb has occurred in a relevant block (that the number of determination readings is equal to or greater than the threshold 2) or that read disturb is apt to occur in the relevant block (that the number of determination readings is equal to or greater than the threshold 1), and transmit the obtained request sense format to the higher-level device 100.

In the process where the CPU 210 transmits the request sense format, for instance, the flash memory package 200 may transmit the request sense format in response to a read request from the higher-level device 100. In this case, the higher-level device 100 can receive the request sense format in an auto sense and acquire the determination code that indicates that read disturb has occurred in the relevant block (that the number of determination readings is equal to or greater than the threshold 2) or that read disturb is apt to occur in the relevant block (that the number of determination readings is equal to or greater than the threshold 1).

Moreover, in another process where the CPU 210 transmits the request sense format, for instance, the flash memory package 200 may receive a request sense command from the higher-level device 100, and transmit the request sense format in response to the request sense command.

FIG. 14 is a diagram showing a configuration example of the request sense format according to the embodiment.

As the determination codes of a request sense format 1400, which indicate that read disturb has occurred in a relevant block (that the number of determination readings is equal to or greater than the threshold 2) or that read disturb is apt to occur in the relevant block (that the number of determination readings is equal to or greater than the threshold 1), the value of a 0 to 3-bit sense key (SK) of a 2nd byte, the value of an additional sense code (ASC) of a 12th byte, and the value of an additional sense qualifier (ASQ) of a 13th byte are used.

For the determination code indicating that read disturb has occurred in the relevant block (that the number of determination readings is equal to or greater than the threshold 2), sense key=01H, additional sense code=DBH, and additional sense qualifier=02H. For the determination code indicating that read disturb is apt to occur in the relevant block (that the number of determination readings is equal to or greater than the threshold 1), sense key=01H, additional sense code=DBH, and additional sense qualifier=01H.

In a second method where the CPU 210 sends notifications to the higher-level device 100, the CPU 210 may include, in a log page obtained in response to a log sense command obtained by the flash memory package 200 from the higher-level device 100, information that indicates that read disturb has occurred in a block corresponding to LBA (that the number of determination readings is equal to or greater than the threshold 2) or that read disturb is about to occur in the block corresponding to the LBA (that the number of determination readings is equal to or greater than the threshold 1), and transmit the obtained log page to the higher-level device 100. Here, the log page including the information on read disturb is called "read disturb log page."

FIG. 15A is a diagram showing a configuration example of the read disturb log page according to the embodiment. FIG. 15B is a diagram showing a configuration example of read disturb LBA information according to the embodiment.

As shown in FIG. 15A, in a read disturb log page 1501, the number of LBA information items (read disturb LBA information items) that includes the information on read disturb of the log page (information indicating whether read disturb is apt to occur or has occurred) is stored in 4th to 5th bytes, and the set number of read disturb LBA information items is stored in a 16th byte and thereafter.

Each of read disturb LBA information items 1502 is configured as shown in FIG. 15B. When read disturb has occurred in the block corresponding to the LBA (when the number of determination readings is equal to or greater than the threshold 2), "02" is set in a flag of a 15th byte. When read disturb is apt to occur in the block corresponding to the LBA (when the number of determination readings is equal to or greater than the threshold 1), "01" is set in the flag of the 15th byte.

Note that various methods can be used as the method for sending notifications to the higher-level device 100, but, in short, any method can be used as long as the higher-level device 100 can be notified of the information on read disturb.

Next is described a process by the higher-level device 100 (the storage controller 101 in this case), which uses a notification on the information on read disturb from the flash memory package 200.

First, a process where the storage controller 101 receives the request sense format 1400 from the flash memory package 200 in response to a command is described.

Figure 16:
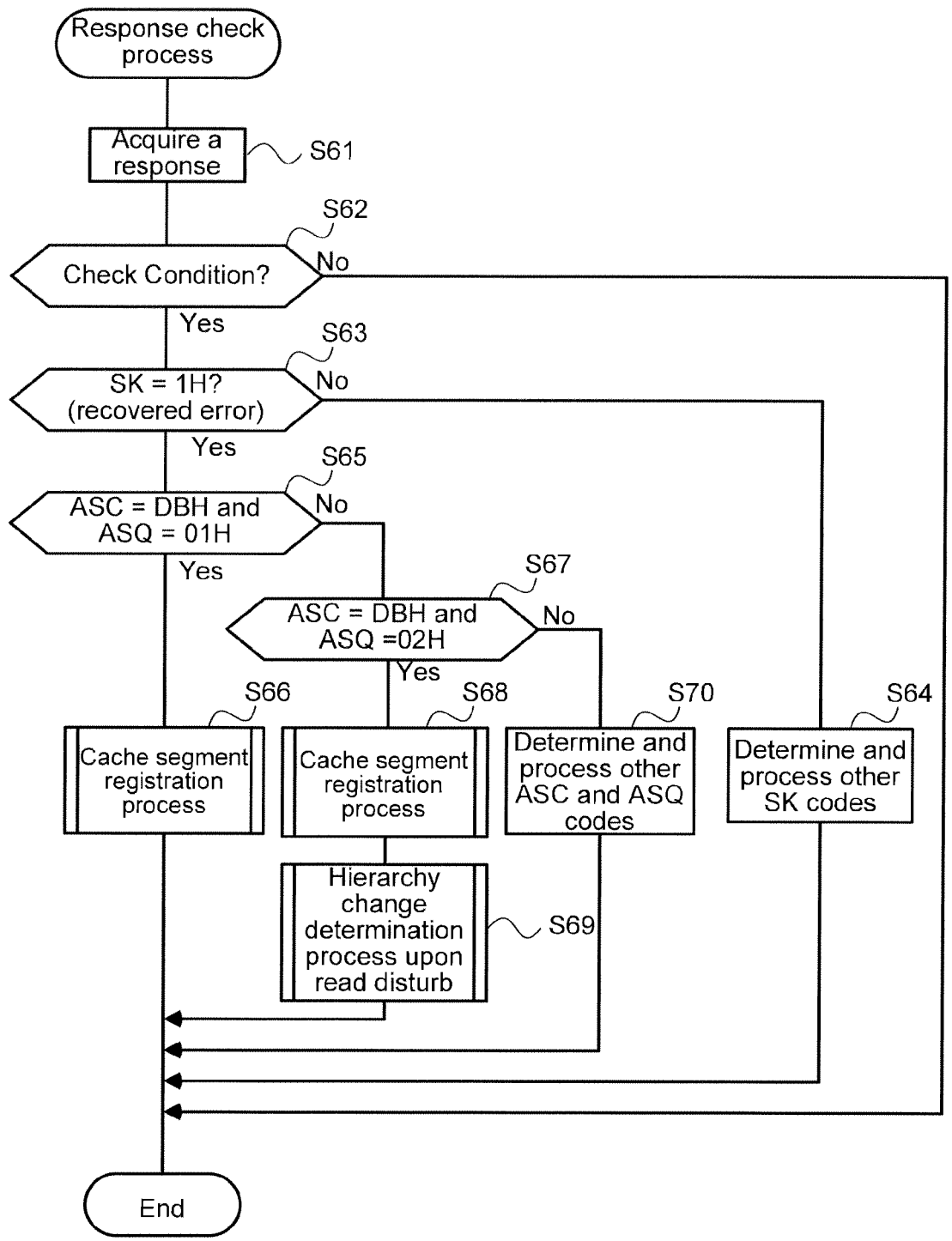
FIG. 16 is a flowchart of an example of a response check process according to the embodiment.

FIG. 16 is a flowchart of an example of a response check process according to the embodiment.

Once the CPU 121 of the storage controller 101 acquires, as a response, the request sense format 1400 from the flash memory package 200 via the backend I/F 150 (step S61), the CPU 121 determines whether the response is in a check condition or not (step S62). When the response is not in the check condition (No in step S62), the CPU 210 ends the process.

However, when the response is in the check condition (Yes in step S62), the CPU 121 determines whether the SK of the request sense format 1400 is 1H or not (step S63). When the SK is not 1H (No in step S63), the CPU 121 determines another SK code, executes a process corresponding to the SK code (step S64), and ends the response check process.

When, however, the SK is 1H (Yes in step S63), the CPU 121 determines whether the ASC is DBH or not and whether the ASQ is 01H or not (step S65). When the ASC is DBH and the ASQ is 01H as a result of the determination (Yes in step S65), it means that read disturb is apt to occur in the relevant block. Therefore, the CPU 121 executes a cache segment registration process (FIG. 21A) for registering the associated cache segment 2001 (FIG. 20) in the memory 122 (step S66), the cache segment 2001 indicating that read disturb is apt to occur, and then ends the process.

Figure 25:
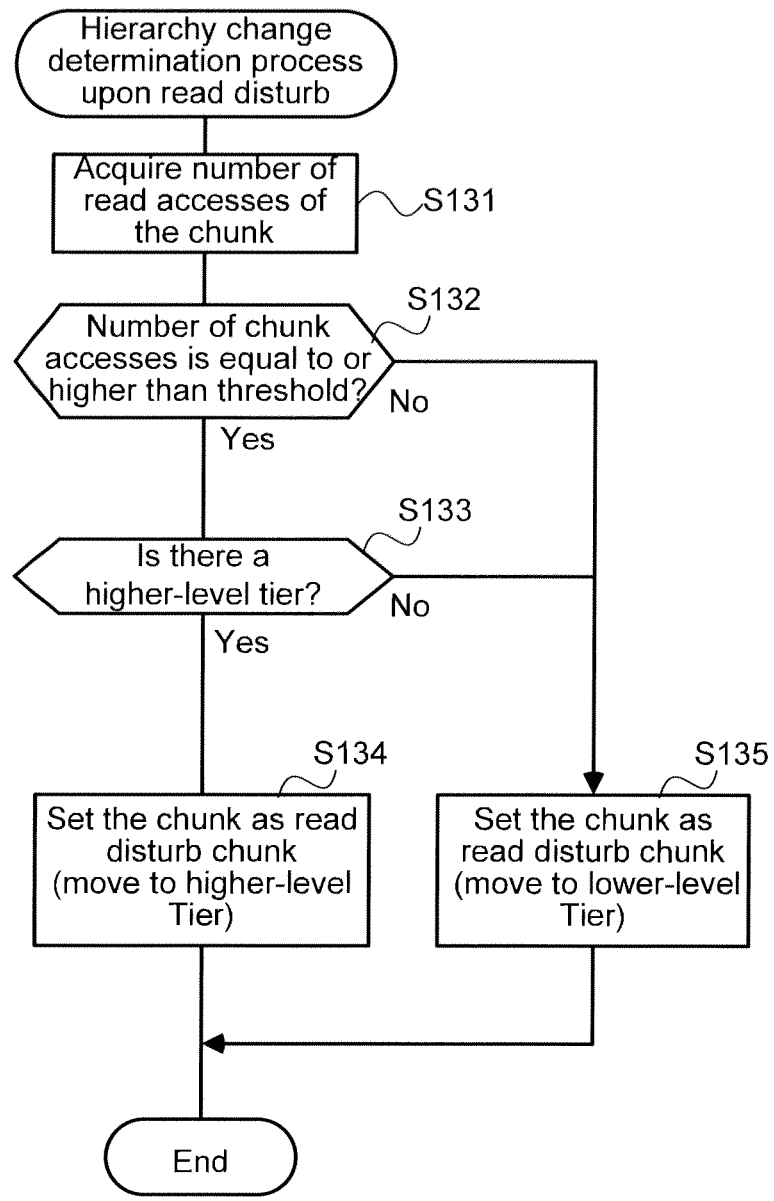
FIG. 25 is a flowchart of an example of a hierarchy change determination process upon read disturb, according to the embodiment.

However, when the ASC is not DBH or the ASQ is not 01H (No in step S65), the CPU 121 determines whether the ASC is DBH or not and whether the ASQ is 02H or not (step S67). When the ASC is DBH and the ASQ is 02H as a result of the determination (Yes in step S67), it means that read disturb has occurred in the relevant block. The CPU 121 therefore executes the cache segment registration process (FIG. 21A) for registering the associated cache segment 2001 (FIG. 20) in the memory 122 (step S68), the cache segment 2001 indicating that read disturb has occurred, and then executes a process for changing a tier that has a chunk including the LBA corresponding to this block (a hierarchy change determination process upon read disturb, etc.: FIG. 25) (step S69).

However, when the ASC is not DBH or the ASQ is not 02H (No in step S67), the CPU 121 determines other ASC and ASQ codes, executes a process corresponding to the codes (step S70), and ends the response check process.

Next is described a process where the storage controller 101 receives the log page 1501 from the flash memory package 200 as a response to the log sense command.

Figure 17:
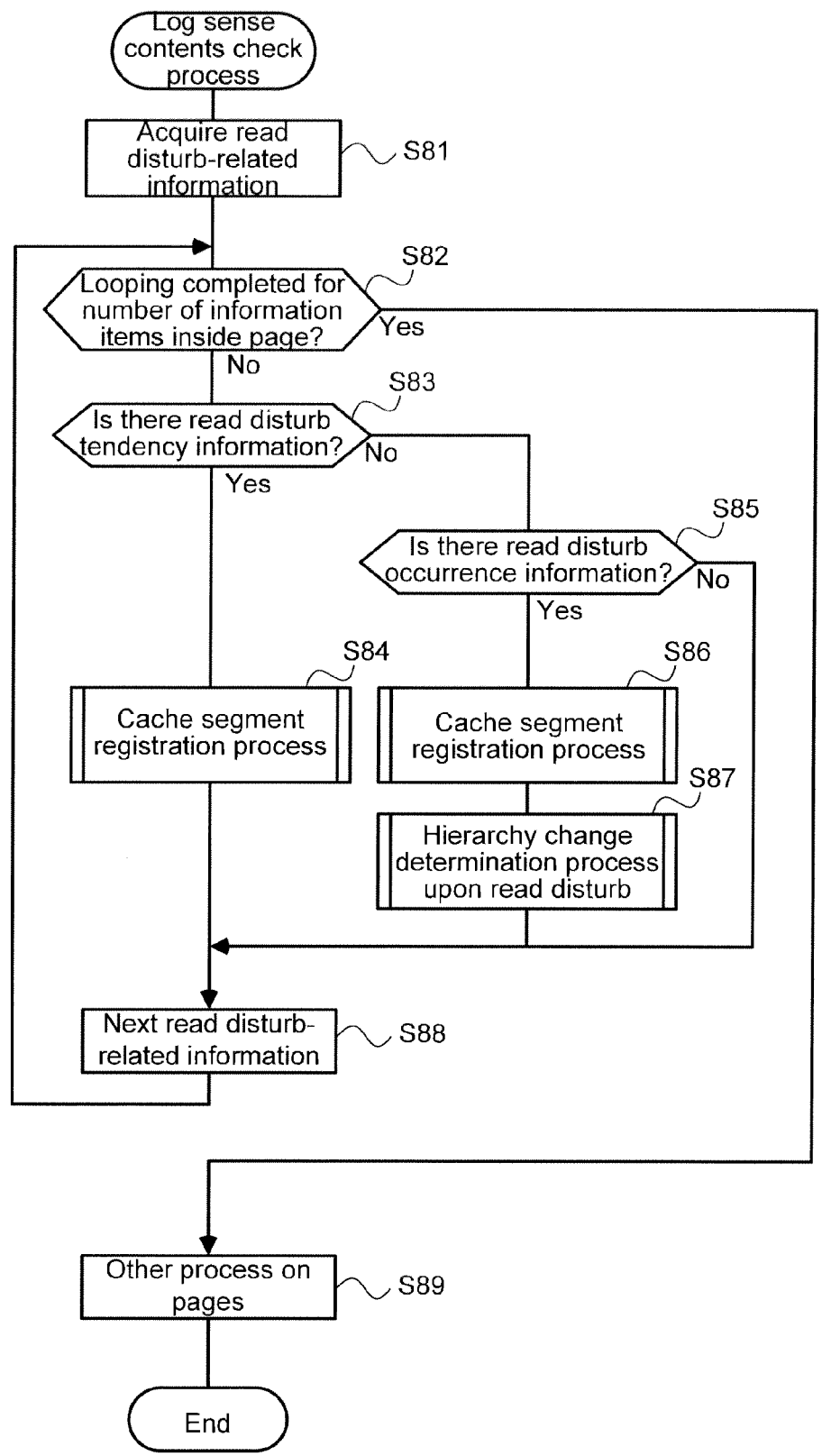
FIG. 17 is a flowchart of an example of a log sense content check process according to the embodiment.

FIG. 17 is a flowchart of an example of a log sense content check process according to the embodiment.

Once the CPU 121 of the storage controller 101 acquires, as a response, the log page 1501 from the flash memory package 200 via the backend I/F 150, the CPU 121 acquires the information on read disturb from the log page 1501, which is, in other words, the number of read disturb LBA information items and the read disturb LBA information (step S81).

Next, the CPU 121 determines whether a process loop is completed for the number of read disturb LBA information items of the log page 1501 (step S82). When the process loop is not completed for the number of read disturb LBA information items of the log page 1501 (No in step S82), the CPU 121 determines whether or not the read disturb LBA information has information indicating the likeliness of the occurrence of read disturb (step S83).

When the information indicating the likeliness of the occurrence of read disturb exists in the read disturb LBA information (Yes in step S83), the CPU 121 executes the cache segment registration process (FIG. 21A) for registering the associated cache segment 2001 (FIG. 20) corresponding to the LBA in the memory 122 (step S84), the cache segment 2001 indicating that read disturb is apt to occur, takes the next read disturb LBA information as a target to be processed (step S88), and proceeds to step S82.

However, when the information indicating the likeliness of the occurrence of read disturb does not exist in the read disturb LBA information (No in step S83), the CPU 121 determines whether the read disturb LBA information has information indicating that read disturb has occurred (step S85).

When the information indicating that read disturb has occurred exists in the read disturb LBA information (Yes in step S85), the CPU 121 executes the cache segment registration process (FIG. 21A) for registering the associated cache segment 2001 (FIG. 20) corresponding to the LBA in the memory 122 (step S86), the cache segment 2001 indicating that read disturb has occurred, executes the process for changing a tier that has a chunk including data of the LBA (the hierarchy change determination process upon read disturb, etc.: FIG. 25) (step S87), takes the next read disturb LBA information as a target to be processed (step S88), and then proceeds to step S82. Note that when the information indicating that read disturb has occurred does not exist in the read disturb LBA information (No in step S85), the CPU 121 proceeds to step S88.

On the other hand, when the process loop is completed for the number of read disturb LBA information items of the log page 1501 (Yes in step S82), the CPU 121 executes other process corresponding to the log page (step S89), and ends the log sense content check process.

In the present embodiment, when read disturb is apt to occur or has occurred in a block, the storage controller 101 manages cache segments related to the LBA corresponding to this block, in a manner as to somewhat prevent the cache segments from being paged-out of the cache memory 122, so that more of the corresponding cache segments relatively exist (tendency to be resident) in the cache memory 122. In this manner, the generation of read requests with respect to the blocks of the flash memory package 200 is alleviated, and hence the occurrence of read disturb in the blocks.

Now, a cache structure managed by the storage controller 101 is described.

Figure 18:
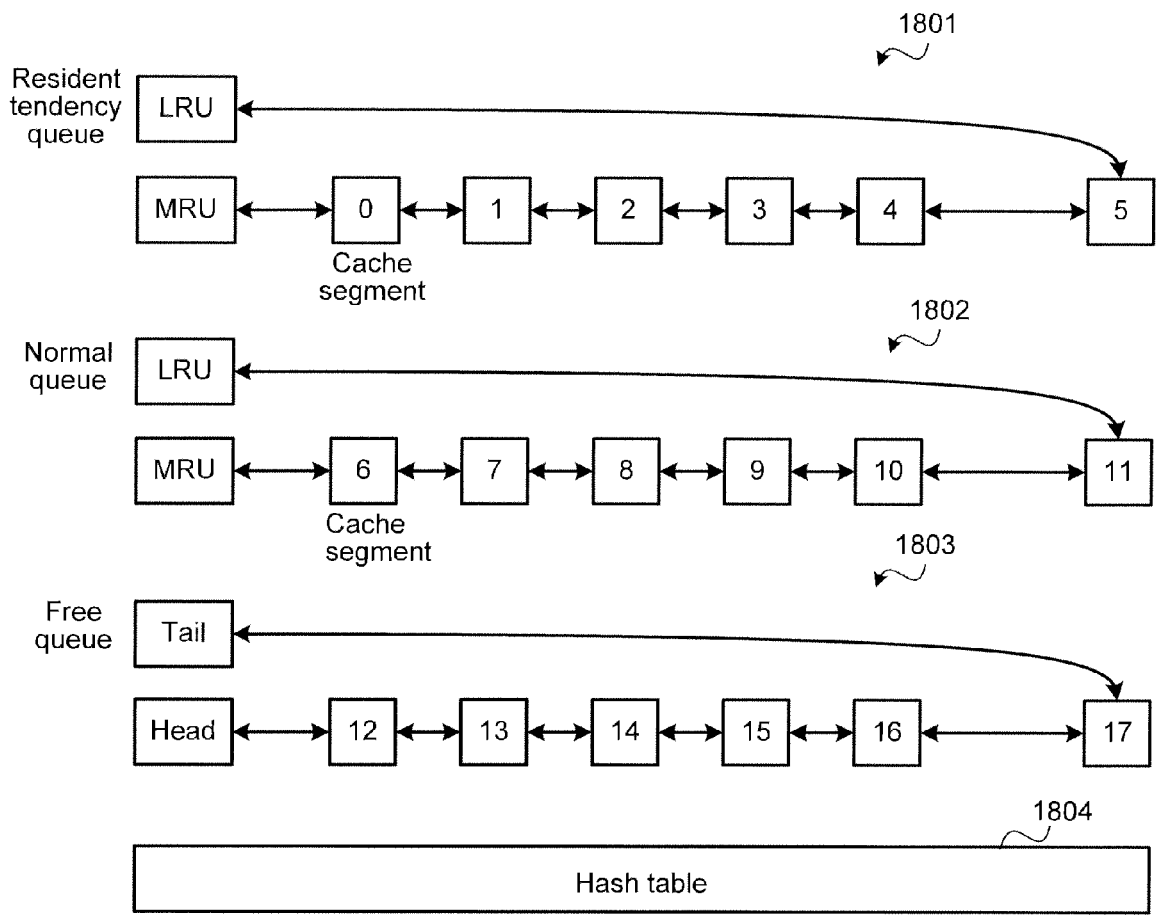
FIG. 18 is a diagram explaining an example of a cache structure according to the embodiment.

FIG. 18 is a diagram explaining an example of a cache structure according to the embodiment.

In the present embodiment, a plurality of cache segments are managed by a resident tendency queue 1801, a normal queue 1802, and a free queue 1803. The resident tendency queue 1801 is a queue for managing cache segments of data of the LBA corresponding to a block in which read disturb is apt to occur or has occurred. The normal queue 1802 is a queue for managing normal cache data. The free queue 1803 is a queue for managing free cache segments in which no data are stored.

In the resident tendency queue 1801 and the normal queue 1802, cache segments that are used most frequently recently out of the cache segments managed in these queues are coupled to MRU (Most Recently Used), and the other cache segments are coupled one after the other. The cache segments that are used least frequently recently out of the cache segments managed in these queues are coupled to LRU (Least Recently Used).

In the free queue 1803, the free cache segments are coupled to the head indicating the top of the queue, and the other cache segments are coupled one after the other. The last free cache segment is coupled to the tail indicating the end of the queue.

Note that a hash table 1804 that allows easy searching of each cache segment may be prepared in the cache structure.

Figure 19:
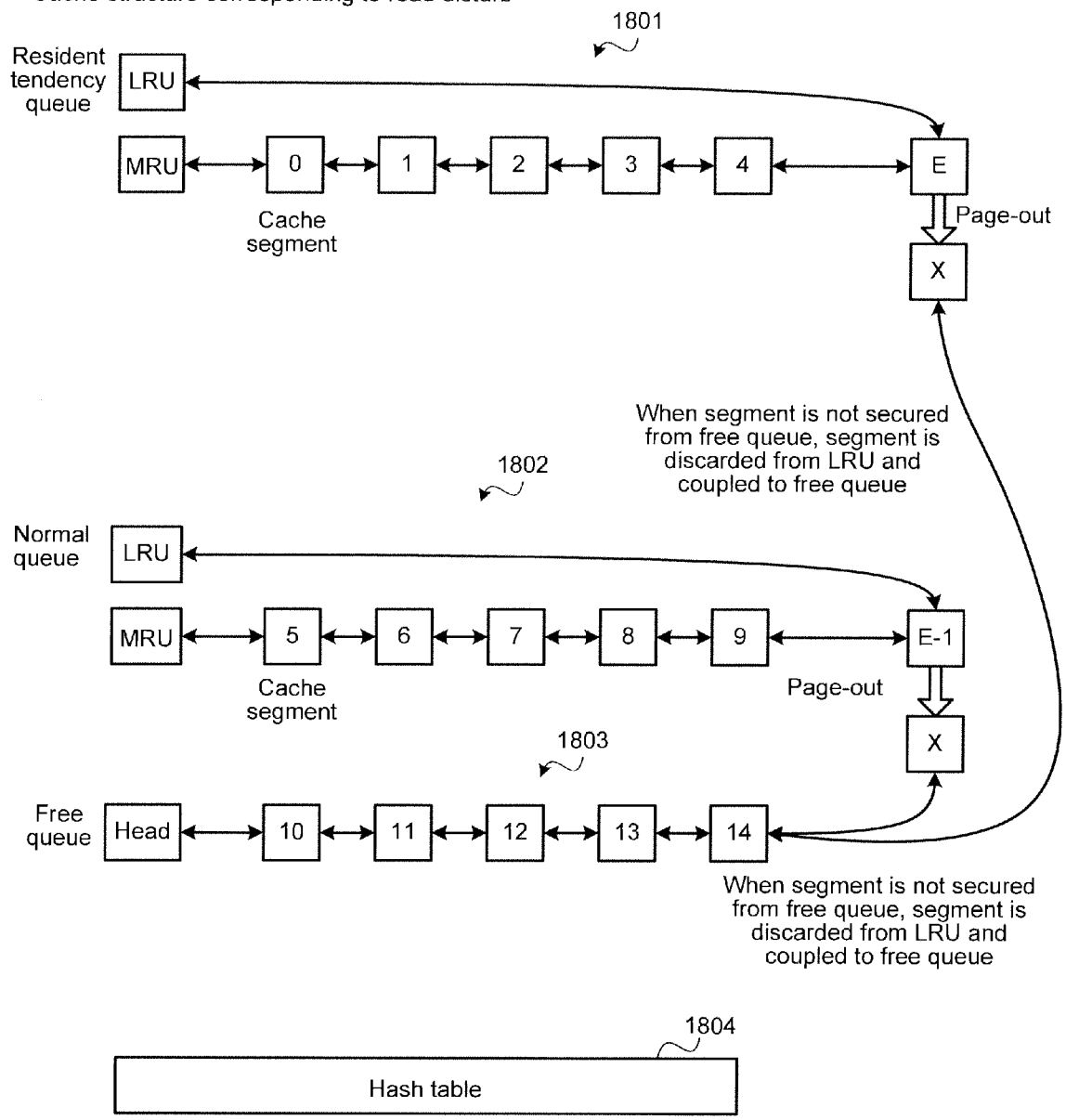
FIG. 19 is a diagram explaining an example of page-out in the cache structure according to the embodiment.

FIG. 19 is a diagram explaining an example of page-out in the cache structure according to the embodiment.

When there are no free cache segments in the free queue 1803 (or the number of free cache segments is equal to or lower than a predetermined number), the CPU 121 of the storage controller 101 extracts (pages-out) the cache segments coupled to the LRU of the resident tendency queue 1801 or the normal queue 1802, from the resident tendency queue 1801 or the normal queue 1802, and couples these cache segments to the end of the free queue 1803, to secure the free cache segments.

Figure 20:
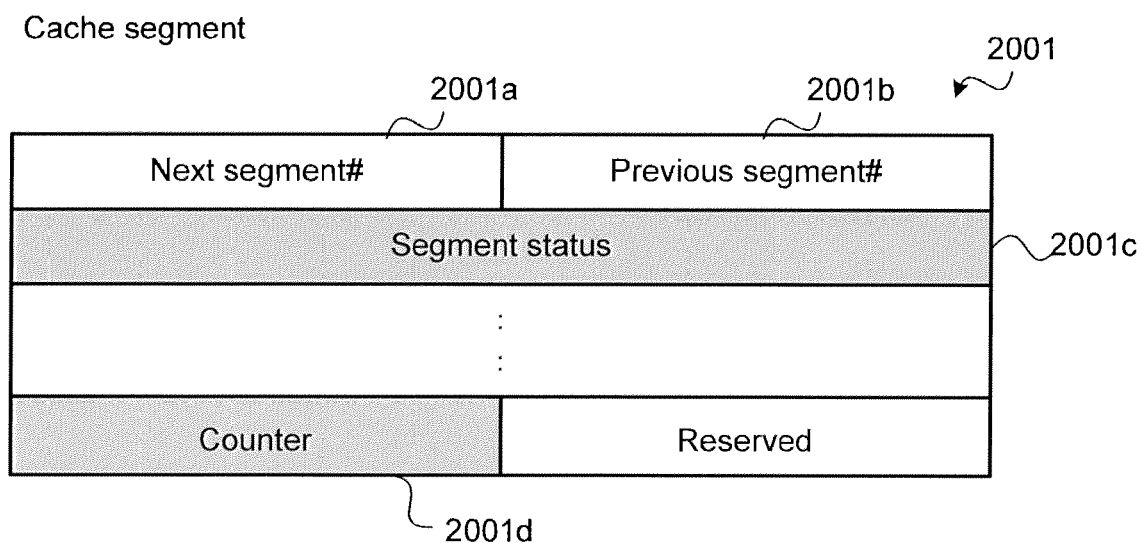
FIG. 20 is a diagram showing a configuration example of a cache segment according to the embodiment.

FIG. 20 is a diagram showing a configuration example of each cache segment according to the embodiment.

The cache segment 2001 has fields for a next segment number (#) 2001a, a previous segment number (#) 2001b, a segment status 2001c, a counter 2001d, and the like.

The next segment number (#) 2001a stores a segment number (#) indicating a next cache segment of a queue to which the cache segment 2001 belongs. The previous segment number (#) 2001b stores a segment number (#) indicating a previous cache segment of the queue to which the cache segment 2001 belongs.

The segment status 2001c stores a status of the cache segment 2001. In the present embodiment, when a flag is put up in a 31st bit of the segment status 2001c, it means that the cache segment 2001 is a read disturb avoiding segment, which is, in other words, a segment that corresponds to the data of the LBA corresponding to the block in which read disturb is apt to occur or has occurred. When a flag is put up in a 30th bit of the segment status 2001c, it means that the cache segment 2001 is a free segment. In addition, when a flag is put up between a 0th bit and a 29th bit of the segment status 2001c, it means that the cache segment 2001 is a normal segment. The counter 2001d stores a counter used for paging-out the cache segment 2001.

Next is described a process operation related to caching in the storage controller 101.

Figure 21A:
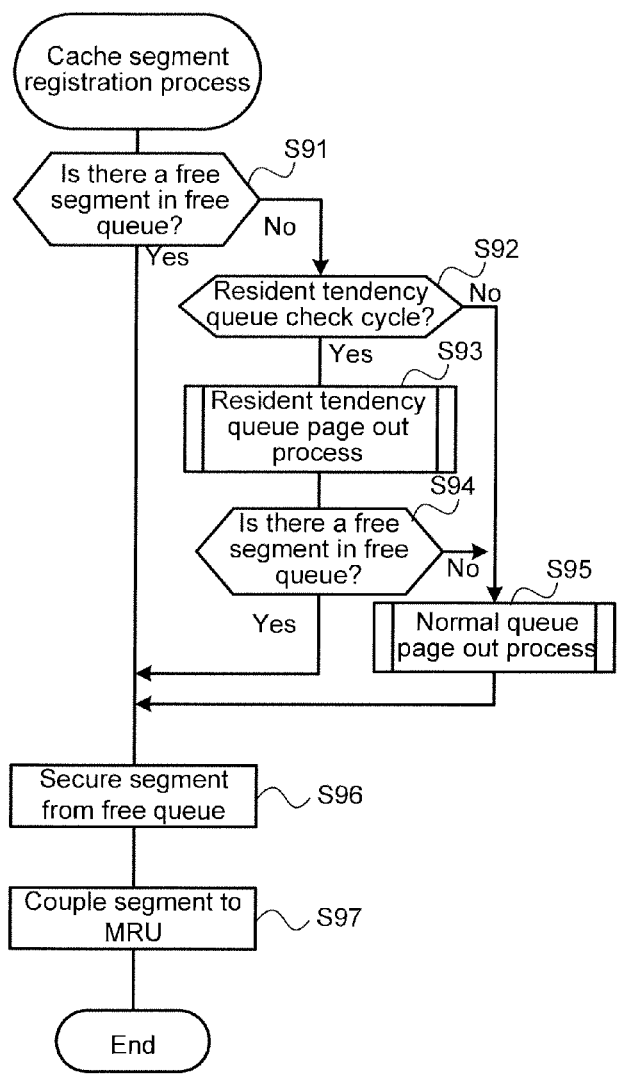
FIG. 21A is a flowchart of an example of a cache segment registration process according to the embodiment.
Figure 21B:
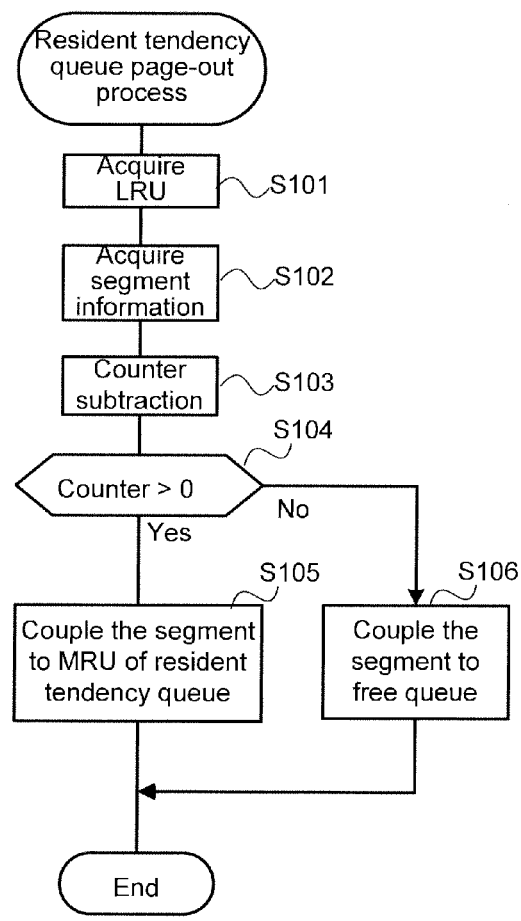
FIG. 21B is a flowchart of an example of a resident tendency queue page-out process according to the embodiment.

FIG. 21A is a flowchart of an example of the cache segment registration process according to the embodiment. FIG. 21B is a flowchart of an example of a resident tendency queue page-out process according to the embodiment.

In the cache segment registration process, the CPU 121 of the storage controller 101 determines whether the free queue has an empty cache segment (free cache segment) or not (step S91). When there exists a free cache segment (Yes in step S91), the CPU 121 proceeds to step S96.

However, when the free queue does not have a free cache segment (No in step S91), the CPU 121 determines whether a resident tendency queue check cycle starts or not (step S92). The resident tendency queue check cycle means a cycle in which the resident tendency queue page-out process is executed. For example, it may be determined that the resident tendency queue check cycle starts each time when the determination step (step S92) is executed a given number of times (e.g., twice). This determination on the resident tendency queue check cycle can make the number of times the resident tendency queue page-out process is executed (FIG. 21B) be lower than the number of times a normal queue page-out process is executed (FIG. 22A), so that the cache segments of the resident tendency queue 1801 are paged-out less frequently.

When it is determined that the resident tendency queue check cycle does not start (No in step S92), the CPU 121 executes the normal queue page-out process (FIG. 22A) (step S95) and proceeds to step S96.

On the other hand, when it is determined that the resident tendency queue check cycle starts (Yes in step S92), the CPU 121 executes the resident tendency queue page-out process (FIG. 21B) (step S93), and determines whether the free cache segment is generated in the free queue or not (step S94).

When the free cache segment is generated in the free queue 1803 (Yes in step S94), the CPU 121 proceeds to step S96. When the free cache segment is not generated in the free queue 1803 (No in step S94), the CPU 121 executes the normal queue page-out process (FIG. 22A) (step S95) and proceeds to step S96.

In step S96, the CPU 121 secures the free cache segment from the free queue 1803 (step S96), sets information on the cache data in this free cache segment 2001, and couples the cache segment to the MRU of the relevant queue (1801 or 1802) (step S97).

Here, when, for example, the data of the LBA corresponding to the block in which read disturb is apt to occur or has occurred are taken as the cache data, information indicating that the segment is a segment corresponding to the block in which read disturb is apt to occur or has occurred is stored in the segment status 2001c of the cache segment 2001, and a predetermined number (e.g., an integer greater than 0) is set in the count 2001d. Then, the cache segment 2001 is coupled to the MRU of the resident tendency queue 1801.

In the resident tendency queue page-out process, the CPU 121 acquires the cache segment 2001 coupled to the LRU of the resident tendency queue 1801 (step S101), acquires the information on the cache segment 2001 (step S102), and subtracts 1 from the value of the counter 2001d of the cache segment 2001 (step S103).

Subsequently, the CPU 121 determines whether the value of the counter 2001d is greater than 0 (step S104). When the value of the counter 2001d is greater than 0 (Yes in step S104), it means it is too soon to page-out the cache segment from the resident tendency queue 1801. Therefore, the CPU 121 couples the cache segment 2001 to the MRU of the resident tendency queue 1801 (step S105), and ends the process.

However, when the value of the counter 2001d is not greater than 0 (No in step S104), it means that the cache segment 2001 is not used for a relatively long period of time and can be paged-out. Therefore, the CPU 121 couples the cache segment 2001 to the free queue 1803 (step S106), and ends the process.

Figure 22A:
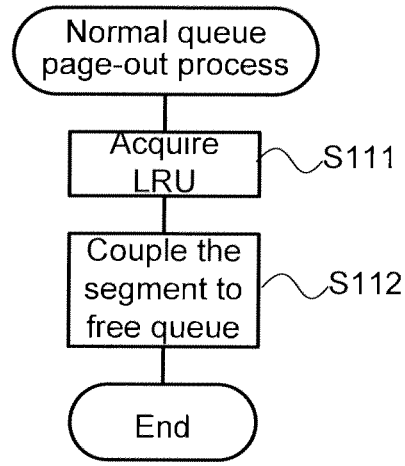
FIG. 22A is a flowchart of an example of a normal queue page-out process according to the embodiment.

FIG. 22A is a flowchart of an example of the normal queue page-out process according to the embodiment.

In the normal queue page-out process, the CPU 121 acquires the cache segment 2001 coupled to the LRU of the normal queue 1802 (step S111), couples the cache segment 2001 to the free queue 1803 (step S112), and ends the process.

In the storage controller 101 according to the present embodiment, when cached data are written, a cache segment having the data is no longer required. Therefore, a segment release process upon writing is performed to release the cache segment.

Figure 22B:
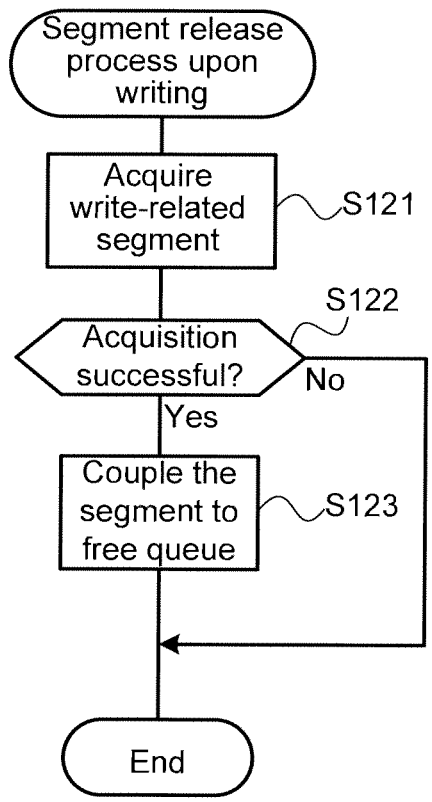
FIG. 22B is a flowchart of an example of a segment release process upon writing, according to the embodiment.

FIG. 22B is a flowchart of an example of the segment release process upon writing, according to the embodiment.

In the segment release process upon writing, when there exists the cache segment 2001 that stores data corresponding to data to be written, the CPU 121 acquires the cache segment 2001 (step S121). When the relevant cache segment 2001 is acquired (Yes in step S122), the CPU 121 couples the cache segment to the free queue 1803 (step S123) and ends the process. However, when the relevant cache segment 2001 cannot be acquired (No in step S122), the CPU 121 ends the process.

Next is described hierarchical control performed on a pool of the storage controller 101 according to the present embodiment.

Figure 23:
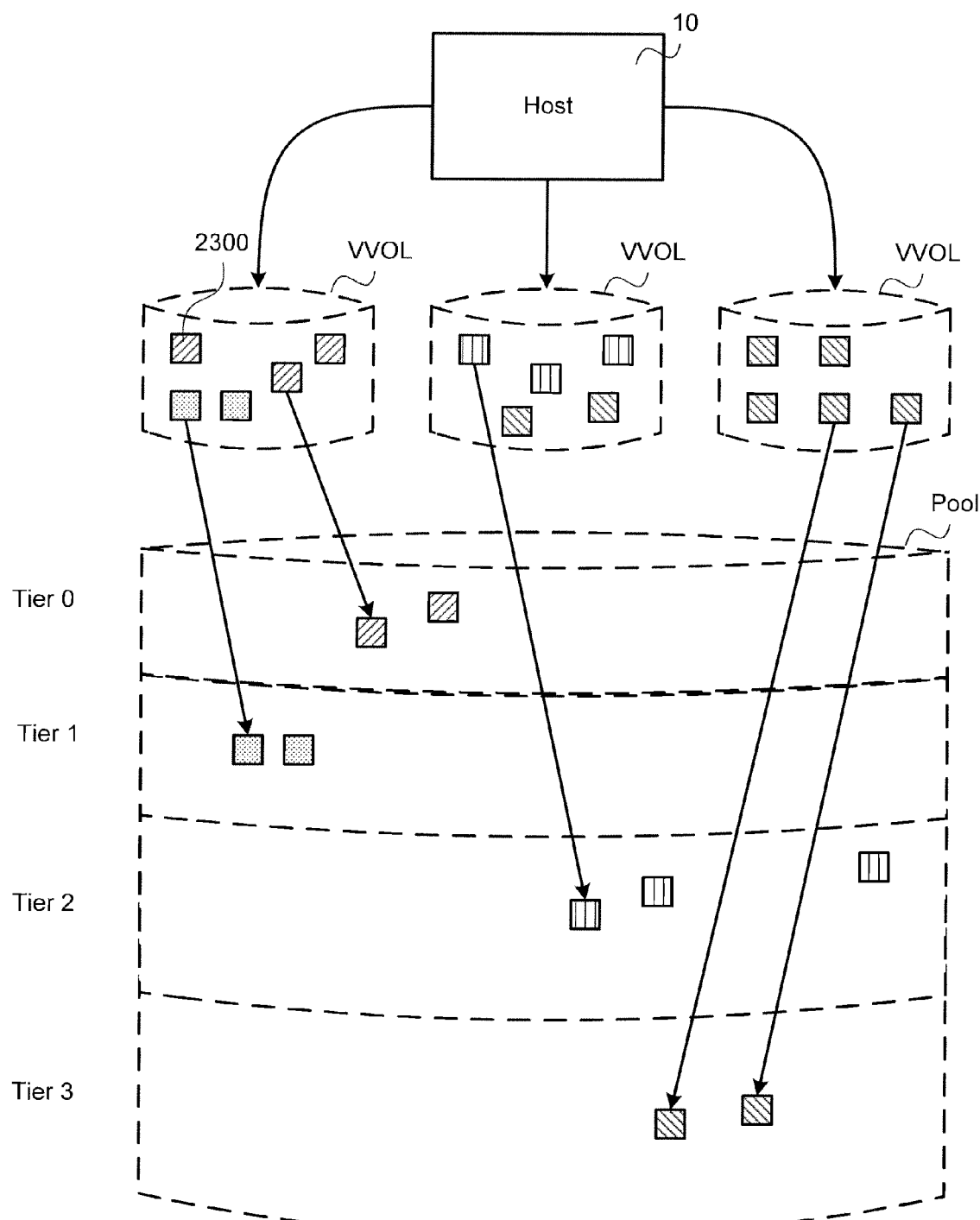
FIG. 23 is a diagram explaining an example of a hierarchical structure according to the embodiment.

FIG. 23 is a diagram explaining an example of a hierarchical structure according to the embodiment.

A pool is allocated to virtual volumes (VVOL) of the host 10. The pool is configured by storage regions based on the plurality of storage units (200, 300, 400, etc.) of different performances, and is sectioned into a plurality of storage tiers (e.g., tiers 0 to 3) according to the performances.

The pool may be configured by, for example, a plurality of logical volumes (VOL), and each VOL may be divided into a plurality of chunks. Each chunk may be configured by a single page allocated to each VVOL or may be configured by a plurality of pages. A plurality of blocks may be allocated to chunks based on the flash memory package.

Each VVOL is a virtual logical volume according to, for example, thin provisioning, which may be configured by a plurality of virtual storage regions. When receiving a write command designating a VVOL, the storage controller determines whether a page is allocated to the virtual storage region to which an address designated by the write command belongs. When a page is not allocated, then a page may be allocated from the pool, and data based on the write command may be written into the page. The page is based on a RAID group, for example, and data based on the data written to the page (e.g., a part of data to be written based on the write command, or a parity) may be written in each of the storage units configuring the RAID group.

For instance, the tier 0 of the highest performance may be taken as a storage region based on an SLC (Single Level Cell) SSD (Solid State Drive), and the tier 1 may be taken as a storage region based on an MLC SSD used as with an SLC, an MLC device package, and an MLC SSD. The tier 2 may be taken as a storage region based on a SAS storage unit, and the tier 3 may be taken as a storage region based on at least one of a SATA storage unit and an NL (Nearline) SAS storage unit. Note that the number of tiers is not limited thereto; thus, for example, the tier 1 may be taken as a next-generation MLC SSD, and the abovementioned tiers 1 to 3 may be taken as tiers 2 to 4.

The storage controller 101 manages in a manner as to be stored in the storage region of any of the tiers on the basis of chunks 2300 as a unit, which are stored in the VVOLs. Here, each chunk 2300 indicates, for example, the amount of data corresponding to the plurality of blocks of the NAND flash memory 203. In other words, the data of the chunks 2300 are stored in the plurality of blocks of the NAND flash memory 203.

Figure 24:
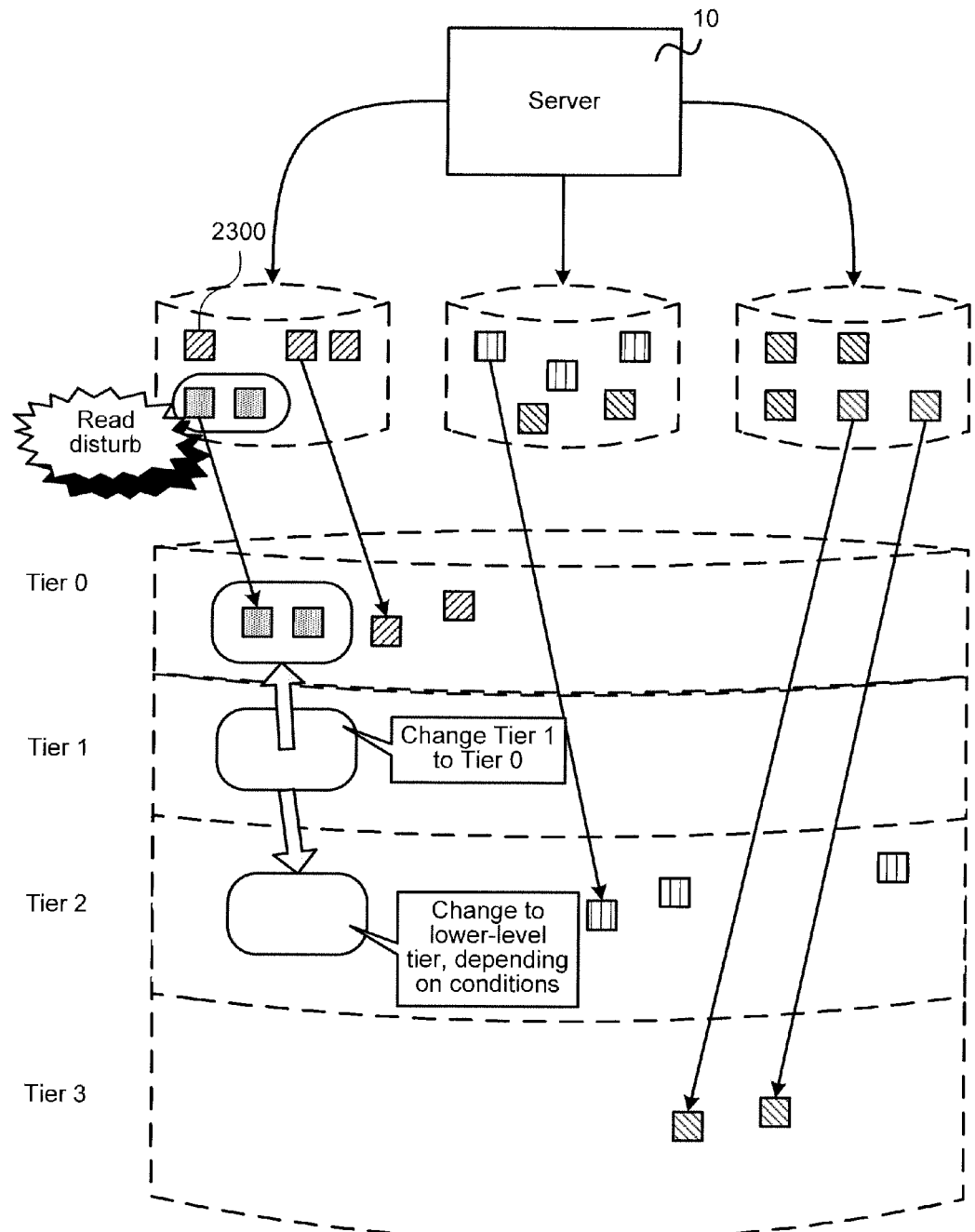
FIG. 24 is a diagram explaining an example of moving a chunk between tiers of the hierarchical structure according to the embodiment.

FIG. 24 is a diagram explaining an example of moving a chunk between tiers of the hierarchical structure according to the embodiment.

In the storage controller 101, basically, the chunks that are accessed frequently are stored in high-speed storage tiers, and the chunks that are accessed less frequently are stored in low-speed storage tiers. In the present embodiment, however, the chunks that include the data stored in a block in which read disturb is apt to occur or has occurred, are moved to storage tiers that are resistant to read disturb (storage tiers that are hardly or never affected by read disturb). For example, when the tier 1 has chunks as shown in FIG. 23, the CPU 121 moves the chunks to the storage tier of the tier 0 that is resistant to read disturb, or to the storage tier of the tier 2 that is resistant to read disturb, as shown in FIG. 24. Whether to move the chunks to the higher-level storage tiers or lower-level storage tiers may depend on various conditions.

Next is described in detail a process operation for changing the storage tiers in the storage controller 101.

FIG. 25 is a flowchart of an example of the hierarchy change determination process upon read disturb, according to the embodiment.

In the hierarchy change determination process upon read disturb (step S69 in FIG. 16, step S87 in FIG. 17), the CPU 121 acquires the number of read accesses to the chunks (step S131). The number of read accesses to each chunk is managed in the memory 124 by the CPU 121.

Next, the CPU 121 determines whether the number of read accesses is equal to or greater than a predetermined chunk access number threshold (step S132). The chunk access number threshold is a threshold for determining whether to move the chunks to the higher-level storage tiers or the lower-level storage tiers, and is set previously in the memory 124.

When the number of read accesses is equal to or greater than the chunk access number threshold (Yes in step S132), the CPU 121 determines whether a higher-level tier exists above a current tier of the relevant chunks (step S133). When there exists the higher-level tier (Yes in step S133), the CPU 121 sets that the chunks as chunks that include the data of the block in which read disturb has occurred, and as chunks to be moved to the higher-level tier (step S134), and ends the process.

However, when the number of read accesses is not equal to or greater than the chunk access number threshold (that is, the number of read accesses is less than the chunk access number threshold) (No in step S132) or when there is no higher-level tier (No in step S133), the CPU 121 sets the chunks as chunks that include the data of the block in which read disturb has occurred, and as chunks to be moved to a lower-level tier (step S135), and ends the process.

Figure 26A:
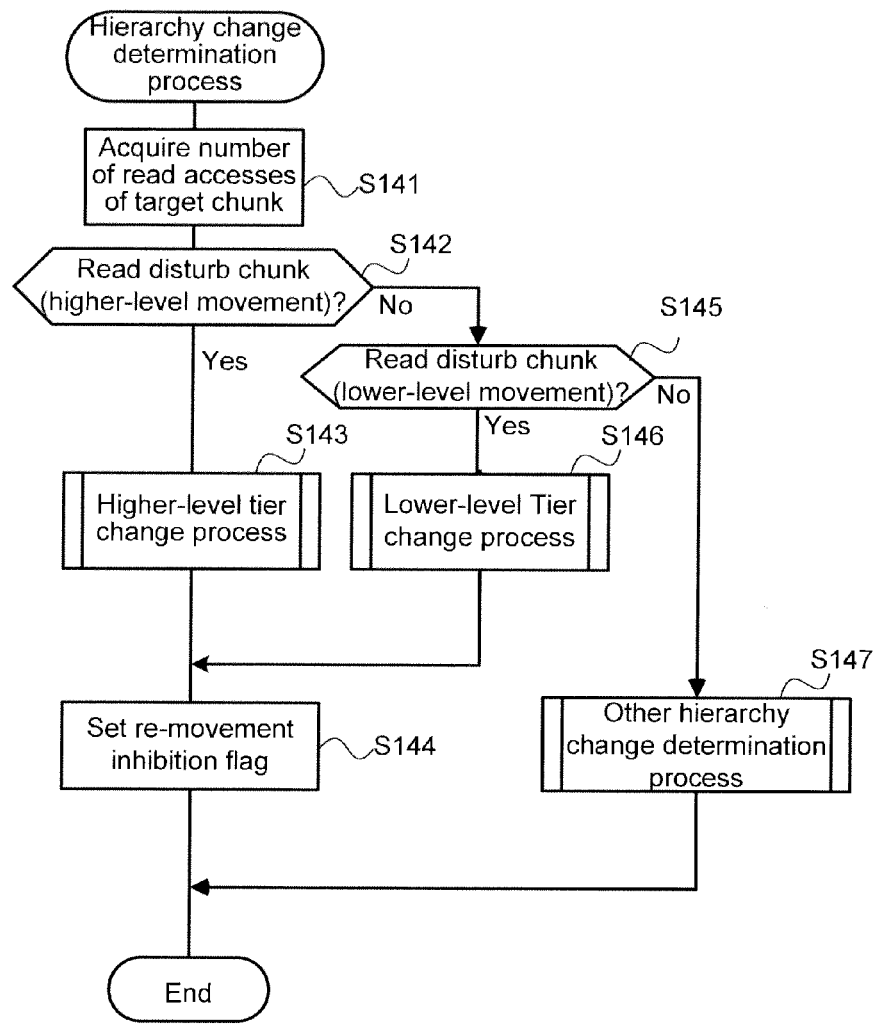
FIG. 26A is a flowchart of an example of a hierarchy change determination process according to the embodiment.
Figure 26B:
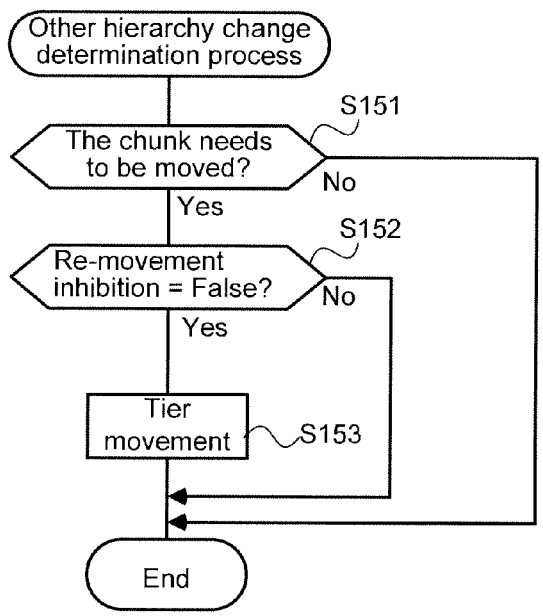
FIG. 26B is a flowchart of an example of another hierarchy change determination process according to the embodiment.

FIG. 26A is a flowchart of an example of a hierarchy change determination process according to the embodiment. FIG. 26B is a flowchart of an example of another hierarchy change determination process according to the embodiment.

The hierarchy change determination process is activated and executed periodically by means of polling. In the hierarchy change determination process, the CPU 121 acquires the number of read accesses to a chunk to be processed (step S141), and determines whether the chunk is a chunk that includes the data of the block in which read disturb has occurred, and a chunk to be moved to a higher-level tier (step S142).

When the chunk includes the data of the block in which read disturb has occurred and is to be moved to a higher-level tier (Yes in step S142), the CPU 121 executes a higher-level tier change process (FIG. 28) (step S143), sets a re-movement inhibition flag to "true" to prevent the chunk from being moved thereafter to another tier (step S144), and ends the process.

On the other hand, when the chunk includes the data of the block in which read disturb has occurred but is not to be moved to a higher-level tier (No in step S142), the CPU 121 determines whether the chunk is a chunk that includes the data of the block in which read disturb has occurred, and is a chunk to be moved to a lower-level tier (step S145).

When the chunk includes the data of the block in which read disturb has occurred and is to be moved to a lower-level tier (Yes in step S145), the CPU 121 executes a lower-level tier change process (FIG. 29) (step S146), sets the re-movement inhibition flag to "true" to prevent the chunk from being moved thereafter to another tier (step S144), and ends the process.

However, when the chunk includes the data of the block in which read disturb has occurred but is not to be moved to a lower-level tier (No in step S145), the CPU 121 executes another hierarchy change determination process (FIG. 26B) (step S147), and ends the process.

In the other hierarchy change determination process, the CPU 121 determines whether the chunk needs to be moved to a tier (step S151). When the chunk needs to be moved (Yes in step S151), the CPU 121 determines whether the re-movement inhibition flag of the chunk is set to "false" (step S152).

When the re-movement inhibition flag is set to "false" (Yes in step S152), it means that the chunk does not include the block in which read disturb has occurred. Therefore, the CPU 121 moves the chunk to a tier according to the situation (step S153), and ends the process. However, when the chunk does not need to be moved to a tier (No in step S151) or when the re-movement inhibition flag is not set to "false" (No in step S152), the CPU 121 ends the process without moving the chunk to a tier.

In the present embodiment, the re-movement inhibition flag is used in order not to move a chunk to a storage tier after the chunk is once moved, but the re-movement inhibition flag is not necessarily used.

FIG. 27 is a diagram showing a configuration example of a tier change table according to the embodiment.

The tier change table 132 has fields for a tier 132a, a name 132b, a performance 132c, an impact of read disturb 132d, a destination higher-level tier 132e, and a destination lower-level tier 132f.

The tier 132a stores a tier number. The lower the tier number, the higher the tier is, that is, the higher the performance of the tier. The name 132b stores the name of the storage unit configuring the storage region of each tier. The performance 132c stores a value indicating the performance of each tier. The impact of read disturb 132d stores a value indicating the level of an impact of read disturb. The larger the value of an impact of read disturb 132d, the greater the impact of read disturb. The destination higher-level tier 132e stores a higher-level tier number that is considered suitable as a candidate to which a chunk is moved from a relevant tier, in consideration of the impact of read disturb. The higher-level tier suitable as the candidate is not limited to a tier immediately above the relevant tier. For instance, as shown by the record of the tier 2 in FIG. 27, the destination higher-level tier 132e may show "0" indicating the tier 0 due to a large impact of read disturb on the tier 1. The destination lower-level tier 132f stores a lower-level tier number that is considered suitable as a candidate to which a chunk is moved from the relevant tier, in consideration of the impact of read disturb.

Figure 28:
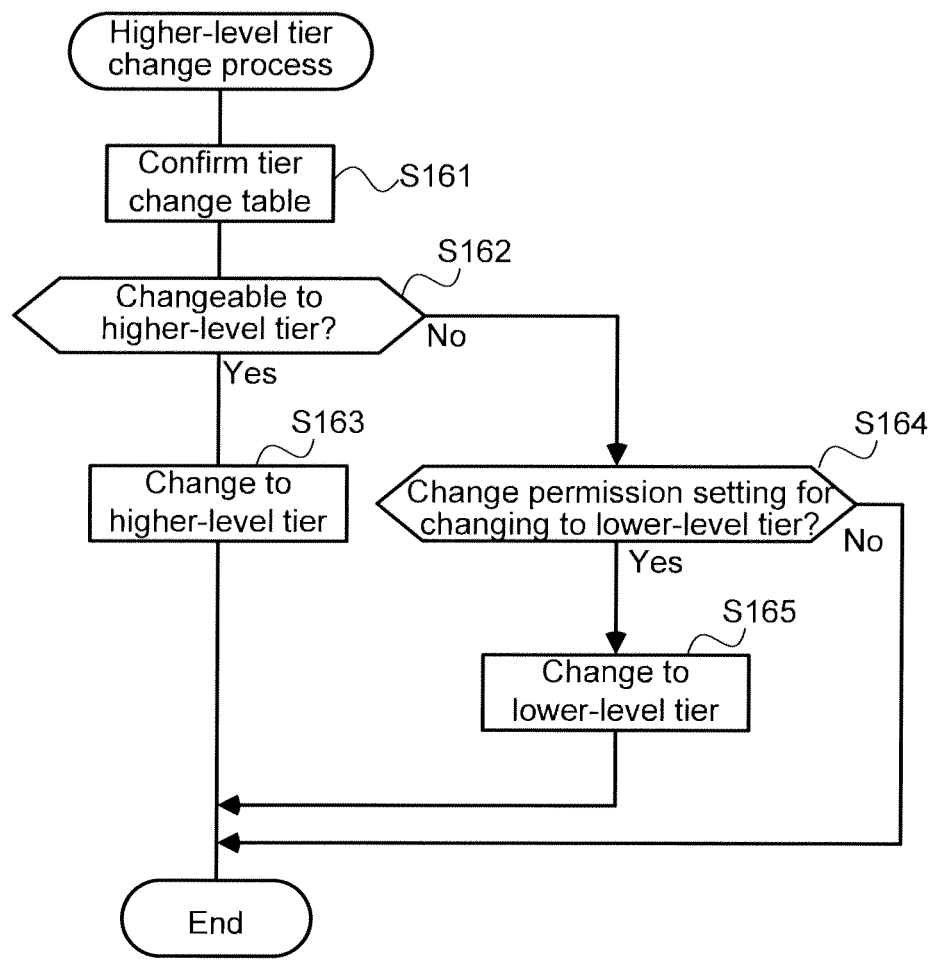
FIG. 28 is a flowchart of an example of a higher-level tier change process according to the embodiment.

FIG. 28 is a flowchart of an example of the higher-level tier change process according to the embodiment.

In the higher-level tier change process (step S143 in FIG. 26A), the CPU 121 checks the tier change table 132 (step S161) to determine whether a tier can be changed to a higher-level tier (step S162). Specifically, the CPU 121 determines, based on the tier change table 132, whether the tier number of the higher-level tier is stored in the destination higher-level tier 132e in the record corresponding to a source tier.

When the tier can be changed to the higher-level tier (Yes in step S162), the storage destination of the chunk is changed to a tier having the tier number stored in the destination higher-level tier 132e of the tier change table 132 (step S163). As a result, the chunk that includes the data of the block in which read disturb has occurred, can be moved to the higher-level tier resistant to read disturb.

However, when the tier cannot be changed to the higher-level tier (No in step S162), the CPU 121 checks a value of a lower-level change permission flag associated to the chunk, and determines whether setting is done for permitting a change of a tier to a lower-level tier (step S164). The lower-level change permission flag can be set by, for example, a user of the host.

When the setting is done to permit the change of a tier to a lower-level tier (Yes in step S164), the storage destination of the chunk is changed to a tier having the tier number stored in the destination lower-level tier 132f of the tier change table 132 (step S165). When the setting is not done to permit the change of a tier to a lower-level tier (No in step S164), the CPU 121 ends the process without changing the storage destination of the chunk. When the storage destination of the chunk is not changed, the execution of a wear leveling technique is expected between the storage units to cope with read disturb.

Figure 29:
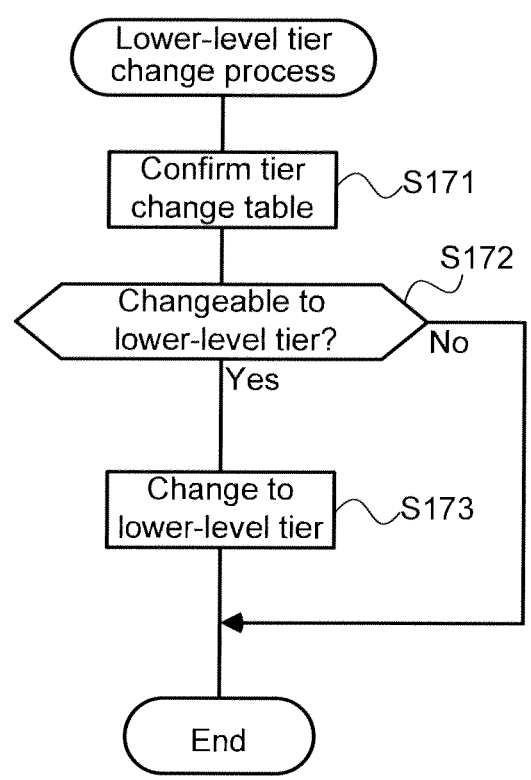
FIG. 29 is a flowchart of an example of a lower-level tier change process according to the embodiment.

FIG. 29 is a flowchart of an example of the lower-level tier change process according to the embodiment.

In the lower-level tier change process (step S146 in FIG. 26A), the CPU 121 checks the tier change table 132 (step S171) to determine whether the tier can be changed to a lower-level tier (step S172). Specifically, the CPU 121 determines, based on the tier change table 132, whether the tier number of the lower-level tier is stored in the destination lower-level tier 132f in the record corresponding to the source tier.

When the tier can be changed to the lower-level tier (Yes in step S172), the storage destination of the chunk is changed to a tier having the tier number stored in the destination lower-level tier 132f of the tier change table 132 (step S173). As a result, the chunk that includes the data of the block in which read disturb has occurred, can be moved to the lower-level tier resistant to read disturb.

When the tier cannot be changed to the lower-level tier (No in step S172), the CPU 121 ends the process without changing the storage destination of the chunk. When the storage destination of the chunk is not changed, the execution of the wear leveling technique is expected between the storage units to cope with read disturb.

Next, the flash memory package according to a modification is described.

The data of the LBA corresponding to the block in which read disturb has occurred, is likely to cause read disturb in a destination block as well.

In the embodiment described above, the occurrence of read disturb is alleviated by caching the relevant data in the higher-level device 100 or moving the relevant data to a read disturb-resistant storage unit, through the storage hierarchy management by the higher-level device 100. However, in some cases the higher-level device 100 does not have such functions. In that case, the occurrence of read disturb needs to be alleviated in the flash memory package 200.

As described above, providing many cache regions to the flash memory package 200 is not realistic. Moreover, measures other than caching needs to be taken in order to cope with read disturb by means of the flash memory package 200.

Generally, the refreshing is performed to move the data of the block in which read disturb has occurred, to another block. However, as described above, moving data to another block does not necessarily prevent the higher-level device from frequently accessing the relevant data. For this reason, read disturb is likely to occur in the future in a destination block as well.

Therefore, in the modification, a less frequently erased block, which is resistant to read disturb, is taken as a destination block to which are moved the data of the block where read disturb has occurred. In the present modification, the less frequently erased block is managed as a block that is used only when moving thereto the data of the block where read disturb has occurred (a read disturb block). The number of read disturb blocks may consist of several percent of the total number of blocks. Note that each read disturb block may be an MLC flash memory, an SLC flash memory, or a high-speed nonvolatile memory that is resistant to read disturb. The number of times the read disturb blocks are erased can be kept low, since the read disturb blocks are used only when moving thereto the data of the block where read disturb has occurred.

The CPU 210 of the flash memory package 200 manages a correspondence of each read disturb block and information specifying the read disturb block, and manages the read disturb block in a queue different from a queue for a normal block.

First, an outline of a process by the flash memory package according to the modification is described. Note that the flash memory package according to the modification has the same configuration as the flash memory package of the embodiment described above, and therefore is described using the reference signs shown in FIG. 1.

Figure 30A:
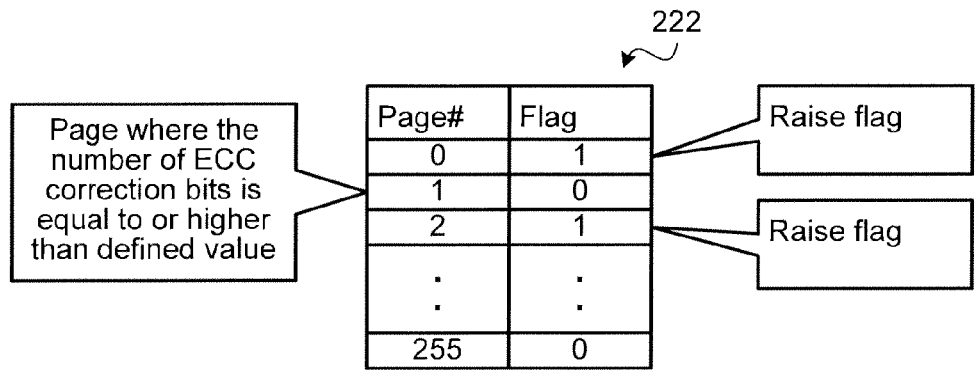
FIG. 30A is a diagram showing a configuration example of a read disturb-inducing page specifying table according to a modification.
Figure 30B:
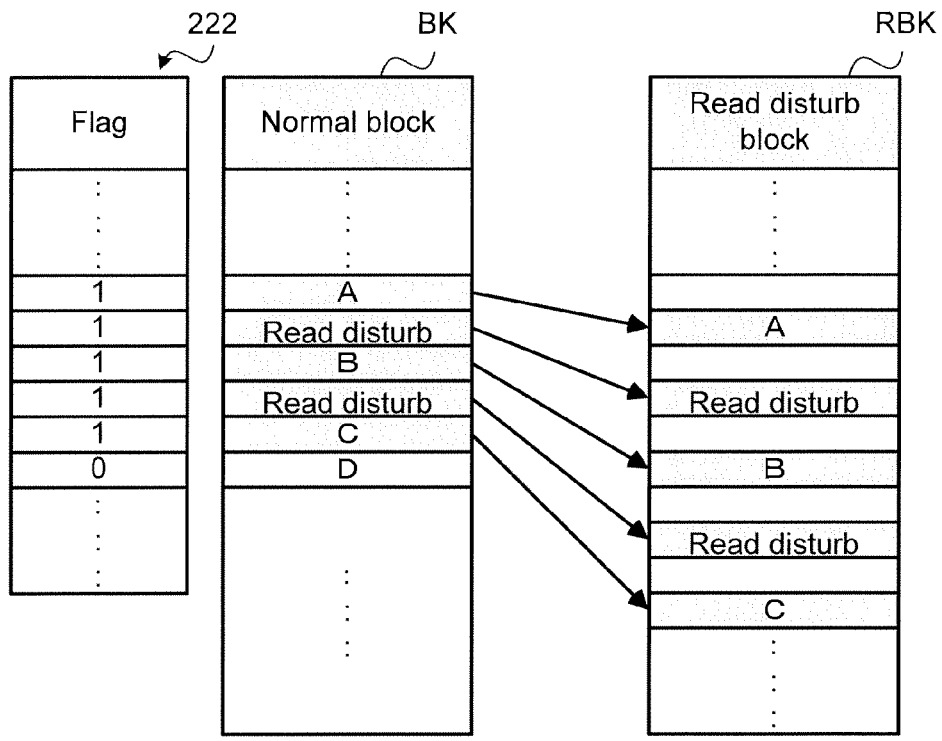
FIG. 30B is a diagram explaining an example of moving a page, according to a modification.

FIG. 30A is a diagram showing a configuration example of a read disturb-inducing page specifying table according to the modification. FIG. 30B is a diagram explaining an example of moving a page, according to the modification.

When a block where read disturb has occurred is detected, the CPU 210 of the flash memory package 200 executes reading of each page of the block, and specifies the number of ECC correction bits of each page.

Based on the number of bits corrected in an ECC error correction process on each page (the number of ECC correction bits), the CPU 210 determines the occurrence of read disturb, and specifies a page inducing the read disturb from the pages. Note that the page inducing the read disturb can be found according to the characteristics of the NAND flash memory 203. In this example, the NAND flash memory 203 is described as having a characteristic of causing read disturb in pages before and after a page to be read.

In this case, due to the characteristic of the NAND flash memory 203, it is determined that the pages before and after the page where read disturb has occurred, are likely to induce read disturb. The result of the determination is managed by a read disturb-inducing page specifying table 222. The read disturb-inducing page specifying table 222 stores a correspondence of a page number of the block and a flag that indicates whether the page corresponding to the page number induces read disturb.

In the present modification, because the pages before and after the page where read disturb has occurred, are considered to induce read disturb, the CPU 210 puts up flags for the pages before and after the page where read disturb has occurred, in the ECC read disturb-inducing page specifying table 222 (the flags indicate "1").

Then, as shown in FIG. 30B, the CPU 210 moves the pages with the flags in the read disturb-inducing page specifying table 222, from the normal block BK where the pages are stored, to a read disturb block RBK. Here, the CPU 210 moves each of the pages to only LSB (Least Significant Bit) pages of the read disturb block RBK. FIG. 30B shows the LSB pages alternately arranged in the read disturb block RBK, but this is merely an example. The arrangement of the LSB pages in the read disturb block RBK is determined based on the configuration of the NAND flash memory 203.

A mode for moving the pages only to the LSB pages of the block is referred to as "SLC mode." The reason that the pages are moved only to the LSB pages is because the LSB pages have better data retaining characteristics than an MSB (Most Significant Bit) page and have a lower possibility of the occurrence of read disturb.

Next, a process by the flash memory package according to the modification is described in detail.

Figure 31:
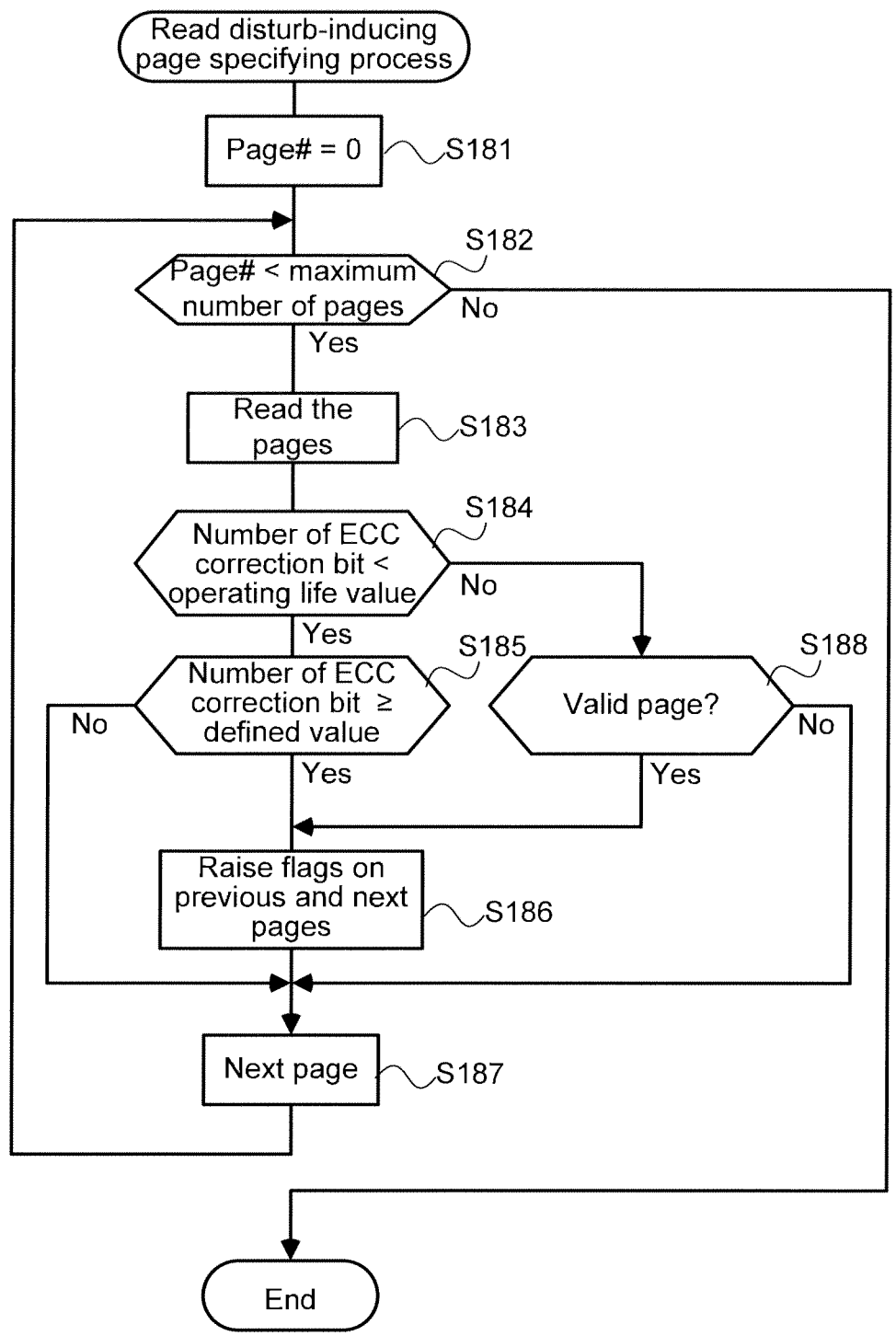
FIG. 31 is a flowchart of an example of a read disturb-inducing page specifying process according to a modification.

FIG. 31 is a flowchart of an example of a read disturb-inducing page specifying process according to the modification.

After the detection of the block where read disturb has occurred, the read disturb-inducing page specifying process is executed for the block to be processed.

In the read disturb-inducing page specifying process, the CPU 210 of the flash memory package 200 sets the page number (#) to 0 (step S181), and determines whether the page # is lower than the maximum number of pages of the block (step S182).

When the page # is lower than the maximum number of pages (Yes in step S182), the CPU 210 reads the page corresponding to the page # of the block to be processed (step S183), executes the ECC error correction process, specifies the number of ECC correction bits, and determines whether the number of ECC correction bits is lower than a predetermined operating life value (step S184). Note that when the page # is not lower than the maximum number of pages (No in step S182), it means that all pages are processed completely. Therefore, the CPU 210 ends the process.

When the number of ECC correction bits is lower than the operating life value (Yes in step S184), the CPU 210 determines whether the number of ECC correction bits is equal to or greater than a defined value that is represented as a standard for the occurrence of read disturb (step S185). When the number of ECC correction bits is equal to or greater than the defined value (Yes in step S185), it means that read disturb has occurred in the relevant page. Therefore, the CPU 210 puts up flags of the read disturb-inducing page specifying table 222 that correspond to pages causing read disturb in the relevant block (e.g., pages before and after the relevant page) (step S186), adds 1 to the page # to obtain the next page as a page to be processed (step S187), and proceeds to step S182.

However, when the number of ECC correction bits is not equal to or greater than the defined value (the number of ECC correction bits is less than the defined value) (No in step S185), it means that read disturb does not occur in the relevant page. Therefore, the CPU 210 proceeds to step S187.

On the other hand, when the number of ECC correction bits is not lower than the operating life value (No in step S184), the CPU 210 determines whether the page is a valid page or not (step S188). When the page is a valid page (Yes in step S188), the CPU 210 proceeds to step S186. When the page is not a valid page (No in step S188), the CPU 210 proceeds to step S187.

Figure 32:
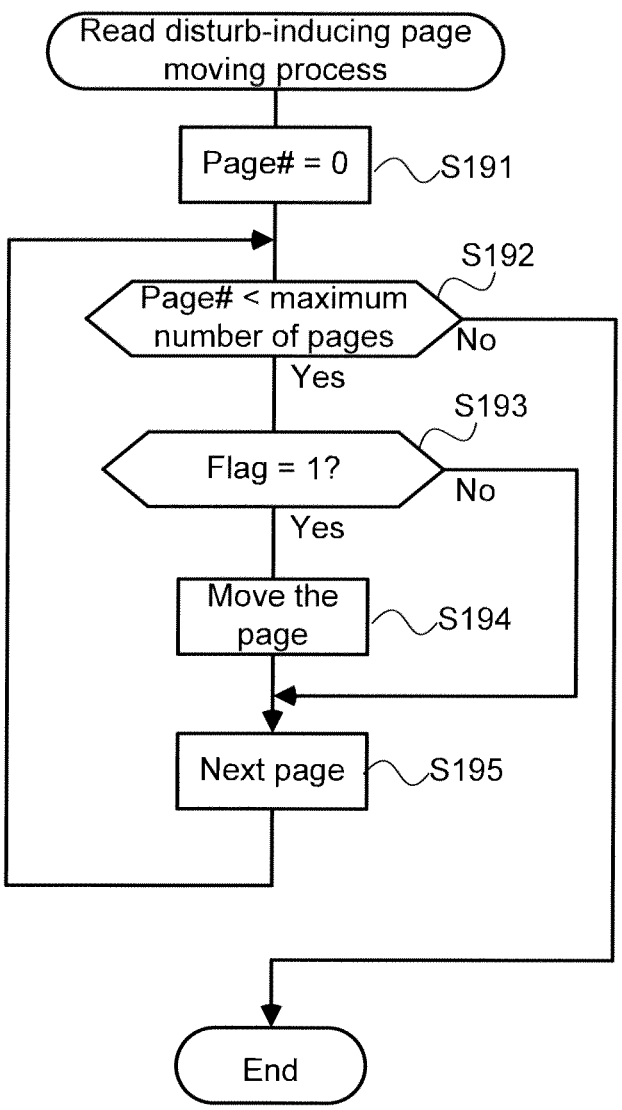
FIG. 32 is a flowchart of an example of a read disturb-inducing page moving process according to a modification.

FIG. 32 is a flowchart of an example of a read disturb-inducing page moving process according to the modification.

The read disturb-inducing page moving process is executed after the execution of the read disturb-inducing page specifying process (FIG. 31).

In the read disturb-inducing page moving process, the CPU 210 of the flash memory package 200 sets the page number (#) to 0 (step S191), and determines whether the page # is lower than the maximum number of pages (step S192).

When the page # is lower than the maximum number of pages (Yes in step S192), the CPU 210 determines whether the flag of the corresponding page of the corresponding block of the read disturb inducing-page specifying table 222 is "1" or not (step S193). When the page # is not lower than the maximum number of pages (No in step S182), it means that all pages are processed completely. Thus, the CPU 210 ends the process.

When the flag is "1" (Yes in step S193), it means that the page is to be moved. Therefore, the CPU 210 moves the page to the read disturb block RBK in the SLC mode (step S194), and proceeds to step S195. In other words, the CPU 210 stores the page in the LSB page of the read disturb block RBK and proceeds to step S195. When the flag is not "1" (No in step S193), the CPU 210 proceeds to step S195.

In step S195, the CPU 210 adds 1 to the page # to obtain the next page as a page to be processed, and proceeds to step S192.

Next is described a process operation that is performed when writing is performed on the page stored in the read disturb block RBK.

Figure 33:
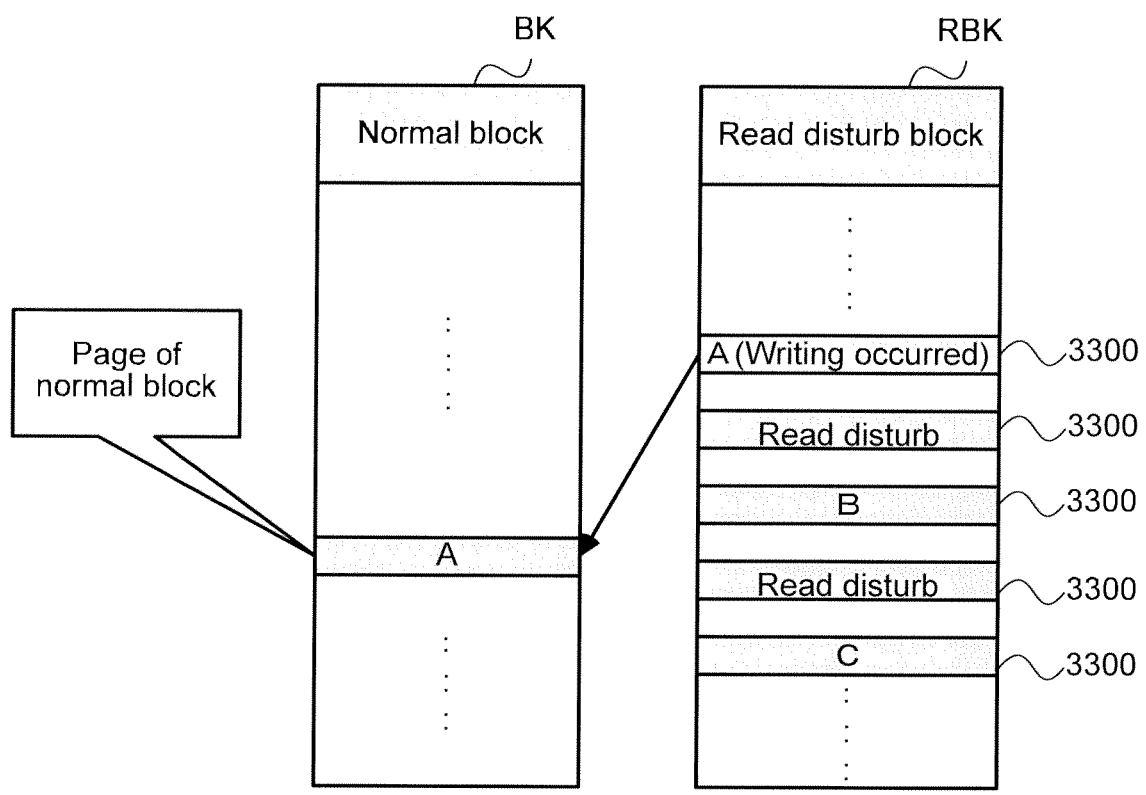
FIG. 33 is a diagram explaining an example of writing a page upon the occurrence of writing, according to a modification.

FIG. 33 is a diagram explaining an example of writing a page upon the occurrence of writing, according to the modification.

When writing is performed on the page stored in the read disturb block RBK, the CPU 210 selects a page of the normal block BK as a write destination to which the data of the page are written, and writes the data into the selected page, as shown in FIG. 33. In this manner, the number of pages available in the read disturb block RBK can be increased.

The above has described the embodiments, but the present invention is not limited thereto. Various changes can be made within the scope of the present invention.

For example, the flash memory package according to the modification may be coupled to the higher-level device 100 according to the above-described embodiment.

The embodiment has described in detail the storage controller 101 as an example of the higher-level device 100; however, when the higher-level device 100 is the PC 102, necessary processes out of the processes realized by the storage controller 101 may be implemented using the CPU, memories and the like provided in the PC 102.

In the embodiment described above, the two thresholds are used in the flash memory package to detect two statuses related to read disturb; however, one threshold may be used for detecting one status related to read disturb.

REFERENCE SIGNS LIST

100 Higher-level device
101 Storage controller
200 Flash memory package

The invention claimed is:

1. A storage system, comprising:
one or more flash memory chips, each of which has a storage region configured by a plurality of blocks; and
a device controller configured to control access to data corresponding to the storage regions of the flash memory chips,
wherein the device controller is configured to:
manage, for each of the blocks, a number of determination readings for determining read disturb on the basis of one or more read requests with respect to data of each block from a higher-level device of the device controller;
when there is a block for which the number of determination readings becomes equal to or larger than a threshold represented as a standard indicating a predetermined state related to read disturb, transmit, to the higher-level device, notification information that includes information indicating that read disturb of the block enters the predetermined state;
take part of a plurality of read requests from the higher-level device as read requests to be added to the number of determination readings; and
randomly determine, within a range of predetermined numbers, a sampling interval representing a number of read requests between a read request to be added to the number of determination readings and a next read request to be added to the number of determination readings, and specify the read request to be added to the number of determination readings, based on the sampling interval,
wherein the threshold includes a first threshold that is a standard for determining that read disturb is apt to occur in the block, and the notification information includes first information indicating that read disturb is apt to occur in the block.

2. The storage system according to claim 1,
wherein the threshold includes a second threshold that is a standard for determining that read disturb has occurred in the block, and
wherein the notification information includes second information indicating that read disturb has occurred in the block.

3. The storage system according to claim 2, comprising:
a plurality of types of storage units of different performances; and
the higher-level device coupled to the plurality of types of storage units,
wherein the higher-level device includes a processor and a cache memory,
wherein each of the plurality of types of storage units includes a flash memory package,
wherein the flash memory package has the one or more flash memory chips and the device controller,
wherein there is a storage region based on the plurality of types of storage units, the storage region being configured by a plurality of different storage tiers according to the different performances of the storage units,
wherein each of the storage tiers is configured by a plurality of chunks, to each of which a plurality of blocks are allocated, and
wherein when receiving the notification information including the second information from the device controller, the processor is configured to move data of a chunk to which a target block of the second information is allocated, to a tier that is different from a tier including the chunk.

4. The storage system according to claim 3, wherein the different tier is a tier exhibiting a higher resistant to read disturb than the tier that includes the chunk to which the target block of the second information is allocated.

5. The storage system according to claim 2, comprising:
a flash memory package; and
the higher-level device coupled to the flash memory package,
wherein the flash memory package has the one or more flash memory chips and the device controller,
wherein the higher-level device includes a processor and a cache memory, and
wherein when receiving the notification information including the first information from the device controller, the processor is configured to manage a first cache segment including data of a target block of the first information, such that the first cache segment in the cache memory becomes more apt to be resident in the cache memory than a cache segment that includes only data of another block that is not a target of the first information.

6. The storage system according to claim 2, wherein when the number of determination readings on the block becomes equal to or greater than the second threshold, the device controller is configured to take the block as a block to be refreshed.

7. The storage system according to claim 1,
wherein the device controller is configured to transmit, to the higher-level device, a response to the read request from the higher-level device, and
wherein the response includes the notification information.

8. The storage system according to claim 1, wherein the threshold is determined for each block.

9. The storage system according to claim 1, wherein the device controller is configured to manage a deterioration level of each of the blocks and to determine the threshold with respect to each of the blocks in accordance with the deterioration level.

10. The storage system according to claim 1, wherein the device controller is configured to read a page of a block determined that read disturb has occurred, and, when the number of ECC correction bits upon reading is equal to or greater than a predetermined level, to move an inducing page that is considered to induce read disturb on the page, to a less frequently erased block.

11. The storage system according to claim 1,
wherein the flash memory package is configured to manage one or more less frequently erased blocks as a read disturb block, which is a destination of a page of a block in which read disturb has occurred, and
wherein the device controller is configured to move the inducing page to the read disturb block.

12. The storage system according to claim 11, wherein the device controller is configured to write the inducing page to an LSB (Least Significant Bit) page of the read disturb block.

* * * * *